(12) United States Patent
Okumura et al.

(10) Patent No.: US 8,710,582 B2
(45) Date of Patent: Apr. 29, 2014

(54) SEMICONDUCTOR DEVICE AND METHOD FOR MANUFACTURING SAME

(75) Inventors: Hideki Okumura, Kanagawa-ken (JP); Hiroto Misawa, Ishikawa-ken (JP); Takahiro Kawano, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 43 days.

(21) Appl. No.: 13/420,545

(22) Filed: Mar. 14, 2012

(65) Prior Publication Data

US 2013/0069146 A1 Mar. 21, 2013

(30) Foreign Application Priority Data

Sep. 16, 2011 (JP) .................................. 2011-203847

(51) Int. Cl.
*H01L 29/792* (2006.01)
*H01L 21/336* (2006.01)

(52) U.S. Cl.
USPC .......................................... 257/326; 438/259

(58) Field of Classification Search
USPC .................. 438/241, 259, 270; 257/318, 326
See application file for complete search history.

(56) References Cited

U.S. PATENT DOCUMENTS

| 6,916,745 B2 | 7/2005 | Herrick et al. |
| 7,344,943 B2 * | 3/2008 | Herrick et al. ................ 438/259 |
| 8,143,123 B2 * | 3/2012 | Grebs et al. ................... 438/259 |

FOREIGN PATENT DOCUMENTS

JP         2002-520851         7/2002

* cited by examiner

*Primary Examiner* — Calvin Lee
(74) *Attorney, Agent, or Firm* — Patterson & Sheridan, LLP

(57) ABSTRACT

According to one embodiment, a method for manufacturing a semiconductor device includes: forming a plurality of trenches; forming a gate insulating film; burying a gate electrode; burying an insulating member; projecting the insulating member; forming a base layer; forming a mask film; forming a first semiconductor layer; forming a carrier ejection layer; forming a first electrode; and forming a second electrode. The projecting includes projecting the insulating member from the upper surface of the semiconductor substrate by removing an upper layer portion of the semiconductor substrate. The mask film is formed so as to cover the projected insulating member. The forming the first semiconductor layer includes forming a first semiconductor layer of the first conductivity type in an upper layer portion of the base layer by doping the base layer with impurity, the upper layer portion having a lower surface below an upper end of the gate electrode.

10 Claims, 14 Drawing Sheets

SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2011-203847, filed on Sep. 16, 2011; the entire contents of which are incorporated herein by reference.

FIELD

Embodiments described herein relate generally to a semiconductor device and a method for manufacturing same.

BACKGROUND

In order to reduce the on-resistance of a power MOSFET (metal-oxide-semiconductor field-effect transistor), a trench gate structure (U-MOS structure) with a gate electrode buried in a semiconductor substrate has been proposed. In the U-MOS structure, a plurality of gate trenches are periodically formed in the upper surface of the semiconductor substrate. A gate electrode is buried in this gate trench. Thus, the region of the semiconductor substrate between the gate trenches is brought into contact with a source electrode. Accordingly, the source layer and the carrier ejection layer connected to the source electrode need to be formed in the region between the gate trenches. Here, the source layer needs to be formed near the gate trench, and the carrier ejection layer needs to be formed in a region spaced from the gate trench. Furthermore, among a plurality of MOSFETs formed in one chip, the distance between the carrier ejection layer and the gate trench needs to be made uniform so that the characteristics such as threshold and on-resistance are made uniform.

On the other hand, in improving the performance of the power MOSFET, increasing the integration density of the U-MOS structure is effective. However, the increase of integration density of the U-MOS structure is restricted by the limit of alignment accuracy between the gate trench and the carrier ejection layer.

DETAILED DESCRIPTION

Figure 1:
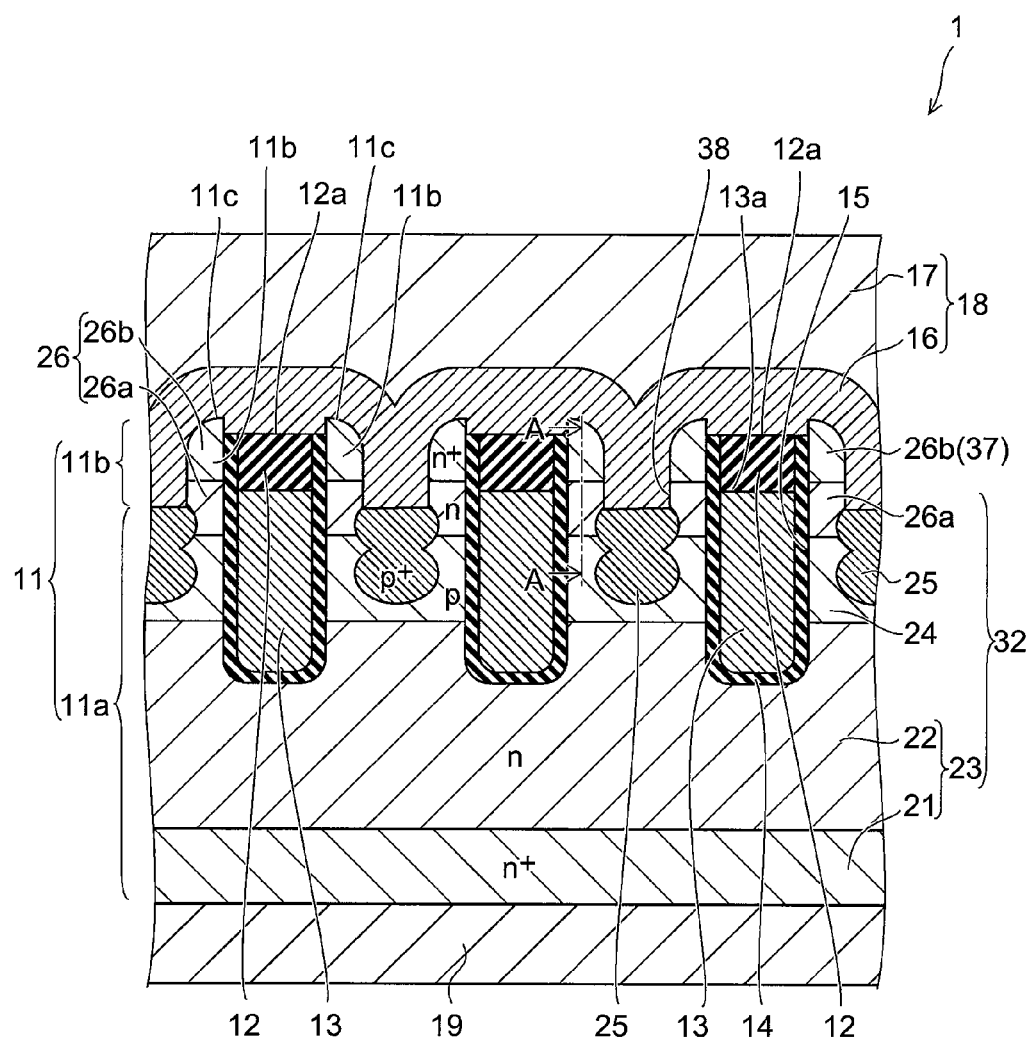
FIG. 1 is a sectional view illustrating a semiconductor device according to a first embodiment.

In general, according to one embodiment, a method for manufacturing a semiconductor device includes: forming a plurality of trenches in an upper surface of a semiconductor substrate of a first conductivity type; forming a gate insulating film on an inner surface of the trench; burying a gate electrode in a lower portion in the trench; burying an insulating member in an upper portion in the trench; projecting the insulating member from the upper surface of the semiconductor substrate by removing an upper layer portion of the semiconductor substrate; forming a base layer of a second conductivity type in a portion of the semiconductor substrate above a lower end of the gate electrode by doping the semiconductor substrate with impurity; forming a mask film so as to cover the projected insulating member; forming a first semiconductor layer of the first conductivity type in an upper layer portion of the base layer by doping the base layer with impurity, the upper layer portion having a lower surface below an upper end of the gate electrode; forming a carrier ejection layer of the second conductivity type in part of the base layer and part of the first semiconductor layer by implanting impurity into the semiconductor substrate using a portion of the mask film formed on a side surface of the insulating member as a mask, the carrier ejection layer having a higher effective impurity concentration than the base layer; forming a first electrode so as to be connected to the upper surface of the semiconductor substrate; and forming a second electrode so as to be connected to a lower surface of the semiconductor substrate.

In general, according to another embodiment, a semiconductor device includes: a semiconductor substrate member with a plurality of pairs of elongated projections formed in an upper surface; an insulating member provided between each pair of the elongated projections and having an upper surface located below an upper end of the elongated projection; a gate electrode provided immediately below the insulating member; a gate insulating film provided between the semiconductor substrate member and the gate electrode; a first electrode connected to the upper surface of the semiconductor substrate member; and a second electrode connected to a lower surface of the semiconductor substrate member, the semiconductor substrate member including: a second semiconductor layer of a first conductivity type connected to the second electrode, a lower end portion of the gate electrode extending into the second semiconductor layer; a base layer of a second conductivity type provided on the second semiconductor layer, the gate electrode penetrating through the base layer; a first semiconductor layer of the first conductivity type constituting the elongated projection and connected to the first electrode; and a carrier ejection layer of the second conductivity type provided immediately below a region of an upper layer portion of the semiconductor substrate member between the pair of the elongated projections, connected to the first electrode, and having a higher effective impurity concentration than the base layer.

In general, according to another embodiment, a semiconductor device includes: a semiconductor substrate member with a plurality of trenches formed in an upper surface; a gate electrode provided in the trench; a gate insulating film provided between the semiconductor substrate member and the gate electrode; a first electrode connected to the upper surface of the semiconductor substrate member; and a second electrode connected to a lower surface of the semiconductor substrate member, the semiconductor substrate member including: a second semiconductor layer of a first conductivity type connected to the second electrode, a lower end portion of the gate electrode extending into the second semiconductor layer; a base layer of a second conductivity type provided on the second semiconductor layer, the gate electrode penetrating through the base layer; a first semiconductor layer of the first conductivity type provided on the base layer and connected to the first electrode; and a carrier ejection layer of the second conductivity type provided in a region spaced from the gate insulating film between the trenches, the carrier ejection layer being connected to the first electrode and having a higher effective impurity concentration than the base layer, and impurity concentration profile along a vertical direction in the first semiconductor layer including a point where impurity concentration discontinuously changes, and the impurity concentration above the point being higher than the impurity concentration below the point.

In general, according to another embodiment, a semiconductor device includes: a semiconductor substrate member made of silicon with a plurality of trenches formed in an upper surface; a gate electrode provided in the trench; a gate insulating film provided between the semiconductor substrate member and the gate electrode; a silicide film in contact with the upper surface of the semiconductor substrate member; a first electrode in contact with an upper surface of the silicide film; and a second electrode connected to a lower surface of the semiconductor substrate member, the semiconductor substrate member including: a second semiconductor layer of a first conductivity type connected to the second electrode, a lower end portion of the gate electrode extending into the second semiconductor layer; a base layer of a second conductivity type provided on the second semiconductor layer, the gate electrode penetrating through the base layer; a first semiconductor layer of the first conductivity type having a lower effective impurity concentration than the silicide film, provided on the base layer, and being in contact with the silicide film; and a carrier ejection layer of the second conductivity type provided in a region spaced from the gate insulating film between the trenches, the carrier ejection layer being connected to the first electrode and having a higher effective impurity concentration than the base layer, and in impurity concentration profile along a vertical direction in the silicide film and the first semiconductor layer, impurity concentration discontinuously changes at an interface between the silicide film and the first semiconductor layer.

In general, according to another embodiment, a semiconductor device includes: a semiconductor substrate member with a plurality of trenches formed in an upper surface; a gate electrode provided in the trench; a gate insulating film provided between the semiconductor substrate member and the gate electrode; a first electrode connected to the upper surface of the semiconductor substrate member; and a second electrode connected to a lower surface of the semiconductor substrate member, the semiconductor substrate member including: a second semiconductor layer of a first conductivity type connected to the second electrode, a lower end portion of the gate electrode extending into the second semiconductor layer; a base layer of a second conductivity type provided on the second semiconductor layer, the gate electrode penetrating through the base layer; a first semiconductor layer of the first conductivity type provided on the base layer and connected to the first electrode; and a carrier ejection layer of the second conductivity type provided in a region spaced from the gate insulating film between the trenches, the carrier ejection layer being connected to the first electrode and having a higher effective impurity concentration than the base layer, and the first semiconductor layer including: a lower section formed from monocrystalline silicon; and an upper section having a higher impurity concentration than the lower section and formed from polycrystalline silicon.

In general, according to another embodiment, a semiconductor device includes: a semiconductor substrate member with a plurality of elongated projections formed in an upper surface; an insulating member buried in the semiconductor substrate member and having an upper portion located in each of the elongated projections; a gate electrode provided immediately below the insulating member; a gate insulating film provided between the semiconductor substrate member and the gate electrode; a first electrode connected to the upper surface of the semiconductor substrate member; and a second electrode connected to a lower surface of the semiconductor substrate member, the semiconductor substrate member including: a second semiconductor layer of a first conductivity type connected to the second electrode, a lower end portion of the gate electrode extending into the second semiconductor layer; a base layer of a second conductivity type provided on the second semiconductor layer, the gate electrode penetrating through the base layer; a first semiconductor layer of the first conductivity type provided on the base layer, covering an upper surface of the insulating member, and being in contact with the first electrode; and a carrier ejection layer of the second conductivity type provided immediately below a region between the elongated projections, being in contact with the first semiconductor layer and the base layer, and having a higher effective impurity concentration than the base layer.

Embodiments of the invention will now be described with reference to the drawings.

First, a first embodiment is described.

FIG. 1 is a sectional view illustrating a semiconductor device according to this embodiment.

Figure 2:
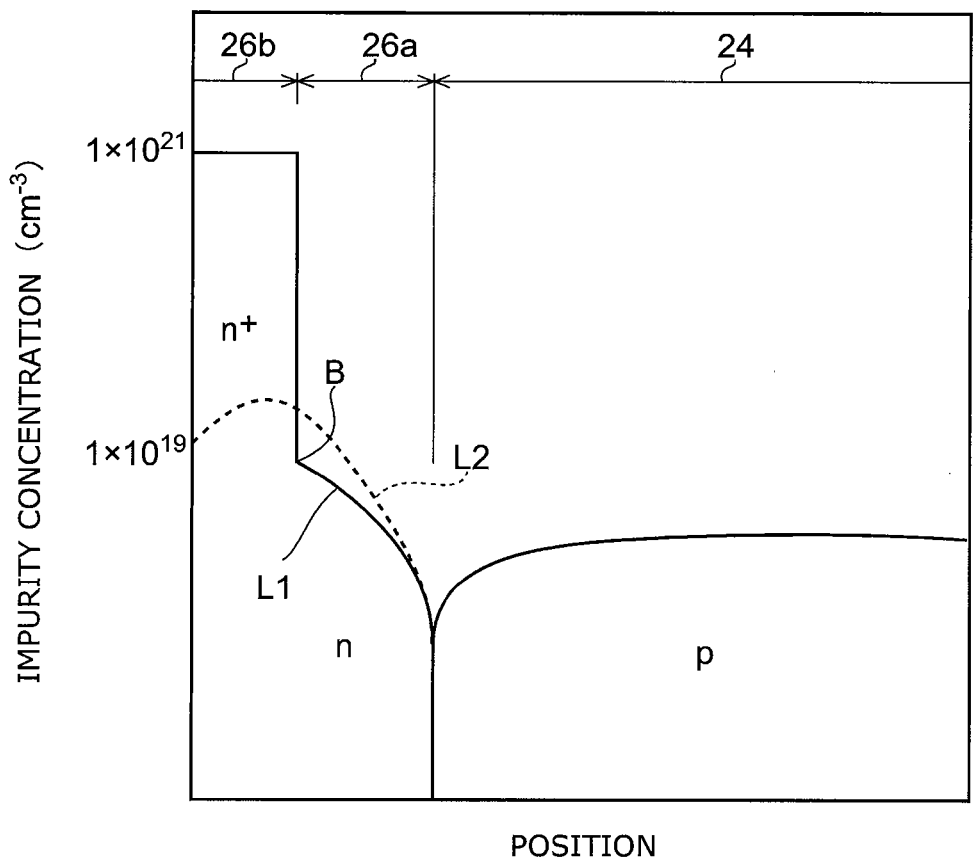
FIG. 2 is a graph illustrating the impurity concentration profile in the source layer, where the horizontal axis represents position along line A-A' shown in FIG. 1, and the vertical axis represents impurity concentration.

FIG. 2 is a graph illustrating the impurity concentration profile in the source layer, where the horizontal axis represents position along line A-A' shown in FIG. 1, and the vertical axis represents impurity concentration.

The semiconductor device according to this embodiment is a low breakdown voltage power MOSFET.

As shown in FIG. 1, the semiconductor device 1 according to this embodiment includes a semiconductor substrate member 11. The semiconductor substrate member 11 includes a silicon substrate formed from monocrystalline silicon, a silicon epitaxial layer formed thereon, and a polycrystalline silicon member provided thereon. That is, the semiconductor substrate member 11 is entirely formed from silicon containing various impurities. The semiconductor substrate member 11 integrally includes a plate-like main body 11a, and a plurality of pairs of elongated projections 11b projected from the upper surface of the main body 11a. Each elongated projection 11b extends in one direction, i.e., the direction perpendicular to the page of FIG. 1. Furthermore, two adjacent elongated projections 11b are paired. The internal structure and fabrication method of the semiconductor substrate member 11 are described later.

In the following, components other than the semiconductor substrate member 11 are described.

An insulating member 12 is provided between the two elongated projections 11b being paired, and includes an insulative material such as silicon oxide. The insulating member 12 is provided for each pair of elongated projections 11b, and extends in the same direction as the elongated projections 11b. The upper surface 12a of the insulating member 12 is located below the upper end 11c of the elongated projection 11b.

A gate electrode 13 is provided immediately below the insulating member 12. The gate electrode 13 includes a conductive material such as polysilicon doped with impurity.

A gate insulating film 14 is provided between the insulating member 12 and the gate electrode 13 on one hand and the semiconductor substrate member 11 on the other, and includes an insulative material such as silicon oxide.

In other words, between each pair of elongated projections 11b, a gate trench 15 extending into the main body 11a is formed, and extends in the same direction as the elongated projections 11b, i.e., the direction perpendicular to the page of FIG. 1.

The gate insulating film 14 is provided on the inner surface of the gate trench 15. In the lower portion in the gate trench 15, a gate electrode 13 is buried via the gate insulating film 14. In the upper portion in the gate trench 15, an insulating member 12 is buried via the gate insulating film 14.

A barrier metal film 16 is provided on the semiconductor substrate member 11. The barrier metal film 16 is made of a conductive material. For instance, the barrier metal film 16 is a two-layer film of a titanium layer and a titanium nitride layer, or a two-layer alloy film of a titanium layer and a tungsten layer. The barrier metal film 16 is in contact with the entire upper surface of the semiconductor substrate member 11 and the entire upper surface 12a of the insulating member 12. On the barrier metal film 16, a metal film 17 made of a metal such as aluminum is provided. The barrier metal film 16 and the metal film 17 constitute a source electrode 18 (first electrode). On the other hand, below the semiconductor substrate member 11, a drain electrode 19 (second electrode) is provided. The drain electrode 19 is e.g. a metal film, and is in contact with the entire lower surface of the semiconductor substrate member 11.

Next, the internal structure of the semiconductor substrate member 11 is described.

The main body 11a of the semiconductor substrate member 11 includes, in its lowermost portion, a silicon substrate 21 made of monocrystalline silicon. The conductivity type of the silicon substrate 21 is n-type. The lower surface of the silicon substrate 21 is in contact with the drain electrode 19.

A drift layer 22 is provided on the silicon substrate 21. The drift layer 22 is made of a silicon epitaxial layer grown on the silicon substrate 21. The conductivity type of the drift layer 22 is n-type. However, the effective impurity concentration of the drift layer 22 is lower than the effective impurity concentration of the silicon substrate 21. The silicon substrate 21 and the drift layer 22 constitute a drain layer 23 (second semiconductor layer).

The term "effective impurity concentration" used herein refers to the concentration of impurity contributing to the electrical conduction of the semiconductor material. For instance, in the case where the semiconductor material contains both donor impurity and acceptor impurity, the "effective impurity concentration" refers to the concentration exclusive of the donor and acceptor canceling out each other.

A base layer 24 and a carrier ejection layer 25 are provided on the drift layer 22. The base layer 24 and the carrier ejection layer 25 are also made of epitaxial layers, and the conductivity type thereof is p-type. However, the effective impurity concentration of the carrier ejection layer 25 is higher than the effective impurity concentration of the base layer 24. The carrier ejection layer 25 is placed between the immediately underlying regions of the elongated projections 11b in the upper layer portion of the main body 11a. The upper surface of the carrier ejection layer 25 is exposed at the upper surface of the main body 11a. The base layer 24 is placed immediately below the elongated projection 11b and below the carrier ejection layer 25 in the upper layer portion of the main body 11a. Here, the base layer 24 may be placed above the lower end of the carrier ejection layer 25.

A source layer 26 (first semiconductor layer) is provided immediately below the elongated projection 11b and in the elongated projection 11b. The lower section 26a of the source layer 26 is formed from an epitaxial layer, i.e., monocrystalline silicon. The lower portion of the lower section 26a is placed immediately below the elongated projection 11b. The upper portion of the lower section 26a constitutes a lower portion of the elongated projection 11b. The upper section 26b of the source layer 26 is made of polycrystalline silicon, and constitutes an upper portion of the elongated projection 11b. The source layer 26 contains donor impurity such as phosphorus. The phosphorus concentration in the upper section 26b of the source layer 26 is higher than the phosphorus concentration in the lower section 26a. Thus, the effective impurity concentration in the upper section 26b is higher than the effective impurity concentration in the lower section 26a.

The lower end portion of the gate electrode 13 extends into the drift layer 22. The intermediate portion of the gate electrode 13 penetrates through the base layer 24. The upper end portion of the gate electrode 13 is located between the lower sections 26a of the two source layers 26 formed in each pair of elongated projections 11b. The upper end 13a of the gate electrode 13 is located above the upper surface of the base layer 24 and the upper surface of the carrier ejection layer 25, and below the upper surface of the lower section 26a of the source layer 26. That is, in the vertical direction, the disposed region of the gate electrode 13 overlaps the disposed region of the drain layer 23, the base layer 24, and the source layer 26. Thus, in the semiconductor device 1, for each source layer 26, an n-channel MOSFET is formed.

As indicated by solid line L1 in FIG. 2, the impurity concentration profile along the vertical direction in the source layer 26 includes a point B where the impurity concentration, i.e., phosphorus concentration, discontinuously decreases when going downward. This point B corresponds to the interface between the upper section 26b and the lower section 26a of the source layer 26. That is, in the impurity concentration profile indicated by solid line L1, the impurity concentration above the point B is sufficiently higher than the impurity concentration below the point B. Specifically, the phosphorus concentration in the upper section 26b of the source layer 26 is generally constant irrespective of the vertical position, such as approximately $1\times10^{21}$ cm$^{-3}$. In contrast, the phosphorus concentration in the lower section 26a is highest in the upper end portion and decreases downward. The phosphorus concentration in the upper end portion of the lower section 26a is e.g. approximately $1\times10^{19}$ cm$^{-3}$.

In the semiconductor device 1 described above, when a negative power supply potential is applied to the source electrode 18 and a positive power supply potential is applied to the drain electrode 19, a depletion layer is formed originating from the interface between the drift layer 22 and the base layer 24. In this state, when a potential higher than the threshold is applied to the gate electrode 13, an inversion layer is provided near the gate insulating film 14 in the base layer 24. Thus, current flows from the drain electrode 19 through the silicon substrate 21, the drift layer 22, the base layer 24, and the source layer 26. On the other hand, when a potential lower than the threshold is applied to the gate electrode 13, the inversion layer vanishes, and the current is blocked. At this time, holes generated in the semiconductor substrate member 11 are rapidly ejected to the source electrode 18 through the carrier ejection layer 25.

Next, a method for manufacturing a semiconductor device according to this embodiment is described.

FIGS. 3A to 3C, FIGS. 4A to 4C, FIGS. 5A to 5C, and FIGS. 6A to 6C are process sectional views illustrating the method for manufacturing a semiconductor device according to this embodiment.

Figure 3A:
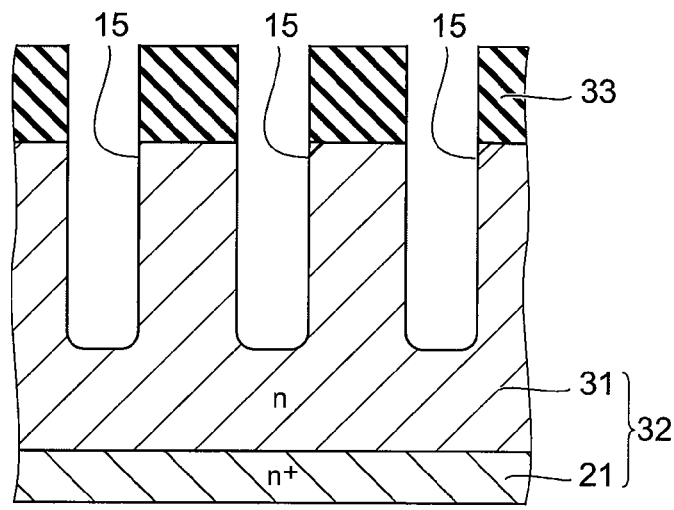
FIGS. 3A to 3C are process sectional views illustrating the method for manufacturing a semiconductor device according to the first embodiment.

First, as shown in FIG. 3A, a silicon substrate 21 made of monocrystalline silicon is prepared. The silicon substrate 21 is doped with donor impurity such as phosphorus. Next, on the upper surface of the silicon substrate 21, silicon is epitaxially grown to form an epitaxial layer 31. The concentration of phosphorus doped in the epitaxial layer 31 is lower than the concentration of phosphorus in the silicon substrate 21. The silicon substrate 21 and the epitaxial layer 31 are collectively referred to as a semiconductor substrate 32. The semiconductor substrate 32 is made of monocrystalline silicon and has n-type conductivity.

Next, for instance, by the thermal oxidation method or CVD (chemical vapor deposition) method, a silicon oxide film is formed on the semiconductor substrate 32. Next, by the lithography method, this silicon oxide film is selectively removed to form a mask member 33 made of e.g. silicon oxide. Next, the mask member 33 is used as a mask to perform anisotropic etching such as RIE (reactive ion etching). Thus, an upper portion of the epitaxial layer 31 is selectively removed to form a plurality of gate trenches 15 extending in one direction at equal spacings. Here, in FIG. 3A, the extending direction of the gate trench 15 is perpendicular to the page. Then, the mask member 33 is removed.

Figure 3B:
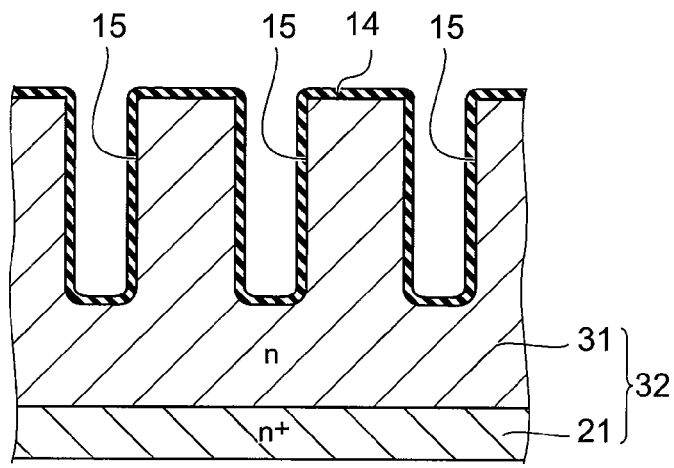

Next, as shown in FIG. 3B, by e.g. thermal oxidation treatment, a gate insulating film 14 is formed on the upper surface of the semiconductor substrate 32. The gate insulating film 14 is formed also on the inner surface of the gate trench 15.

Figure 3C:
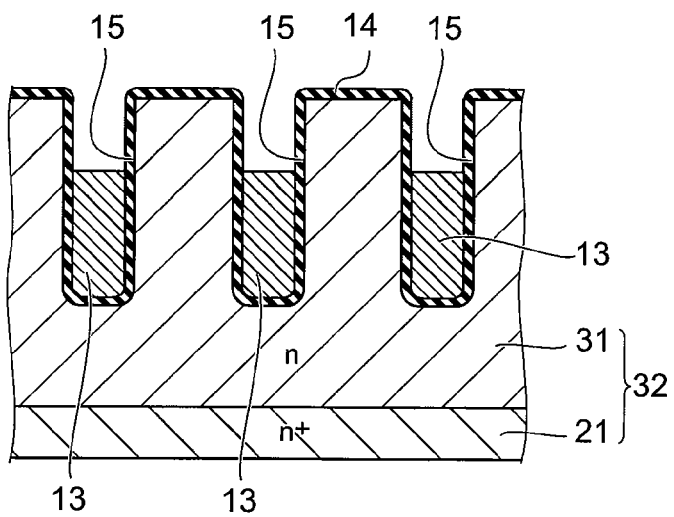

Next, as shown in FIG. 3C, on the entire surface, polycrystalline silicon containing impurity such as phosphorus is deposited. This polycrystalline silicon is buried in the gate trench 15, and also deposited on the upper surface of the semiconductor substrate 32. Next, etch-back is performed. Thus, in the polycrystalline silicon, the portion deposited on the upper surface of the semiconductor substrate 32 and the portion buried in an upper portion in the gate trench 15 are removed. As a result, the polycrystalline silicon is left only in a lower portion in the gate trench 15. Thus, a gate electrode 13 is formed.

Figure 4A:
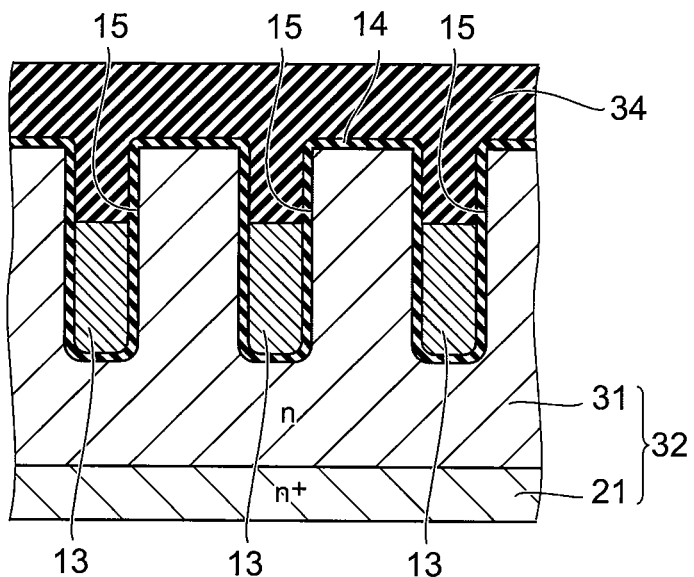
FIGS. 4A to 4C are process sectional views illustrating the method for manufacturing a semiconductor device according to the first embodiment.

Next, as shown in FIG. 4A, by e.g. the CVD method, silicon oxide is deposited on the entire surface to form a silicon oxide film 34. The silicon oxide film 34 fills the portion above the gate electrode 13 in the gate trench 15, and is placed on the upper surface of the semiconductor substrate 32.

Figure 4B:
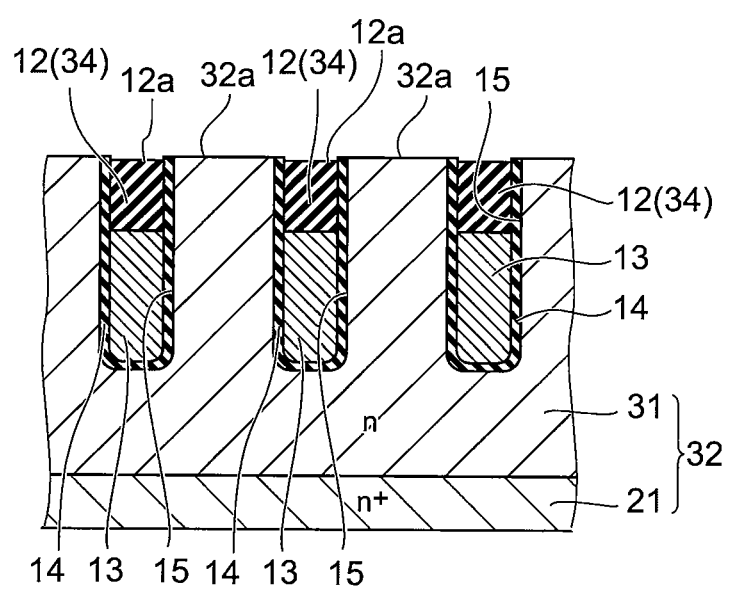

Next, as shown in FIG. 4B, etch-back is performed on the entire surface. Thus, in the silicon oxide film 34 and the gate insulating film 14, the portion formed on the upper surface of the semiconductor substrate 32 is removed. Accordingly, the silicon oxide film 34 is left only in the gate trench 15 to constitute an insulating member 12. At this time, the upper surface 12a of the insulating member 12 and the upper surface 32a of the semiconductor substrate 32 are nearly equal in height.

Figure 4C:
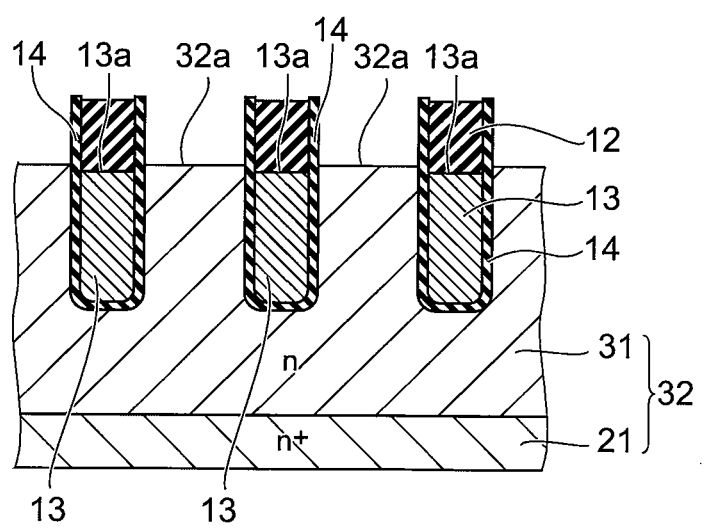

Next, as shown in FIG. 4C, etch-back is performed under a condition such that silicon is selectively etched relative to silicon oxide. Thus, the upper layer portion of the semiconductor substrate 32 is removed. Accordingly, the upper surface 32a of the semiconductor substrate 32 is set back downward. Relatively, most of the insulating member 12 and part of the gate insulating film 14 are projected upward from the upper surface 32a of the semiconductor substrate 32. At this time, the vertical position of the upper surface 32a of the semiconductor substrate 32 is caused not to reach the position of the upper end 13a of the gate electrode 13. Thus, the upper surface 32a is positioned above the upper end 13a.

Figure 5A:
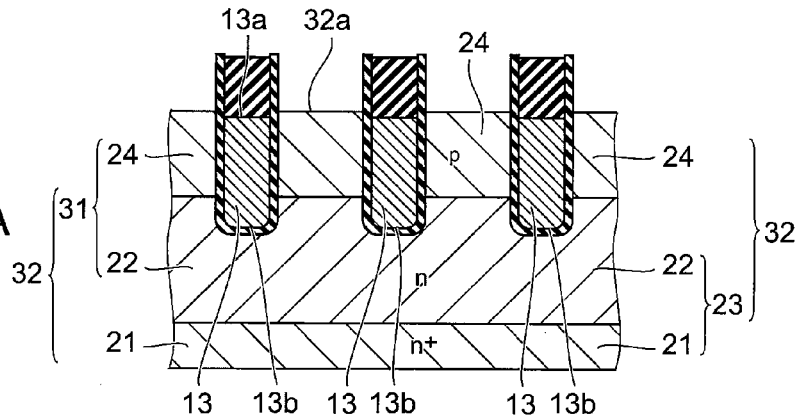
FIGS. 5A to 5C are process sectional views illustrating the method for manufacturing a semiconductor device according to the first embodiment.

Next, as shown in FIG. 5A, acceptor impurity such as boron is ion-implanted into the semiconductor substrate 32 from above. Thus, the conductivity type of the portion of the epitaxial layer 31 above the lower end 13b of the gate electrode 13 is changed from n-type to p-type. At this time, the portion of the epitaxial layer 31 turned to p-type conductivity constitutes a base layer 24. On the other hand, the portion of the epitaxial layer 31 remaining in the n-type conductivity constitutes a drift layer 22. The silicon substrate 21 and the drift layer 22 constitute a drain layer 23.

Figure 5B:
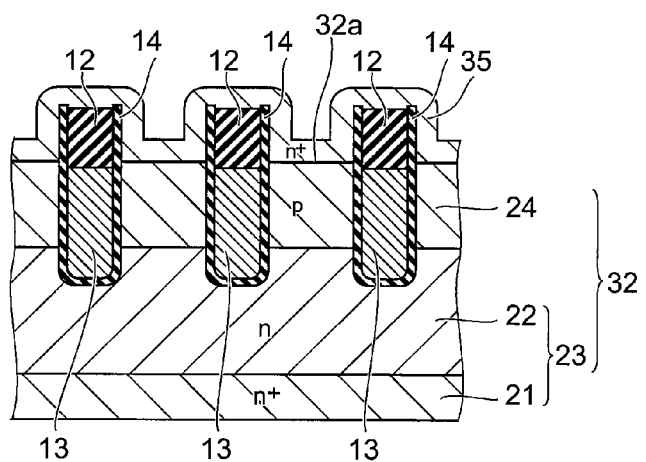

Next, as shown in FIG. 5B, by e.g. the CVD method, polycrystalline silicon is deposited on the entire surface. Next, this polycrystalline silicon is doped with donor impurity such as phosphorus. This phosphorus injection is performed by the so-called phosphorus deposition process. For instance, this is performed by heat treatment in a phosphoryl chloride (phosphorus oxychloride) (POCl$_3$) atmosphere. Thus, an impurity-containing film 35 made of polycrystalline silicon doped with phosphorus at high concentration is formed on the entire surface of the semiconductor substrate 32. The impurity-containing film 35 is in contact with the upper surface 32a of the semiconductor substrate 32, and covers the insulating member 12 and the gate insulating film 14 projected from the upper surface 32a.

Figure 5C:
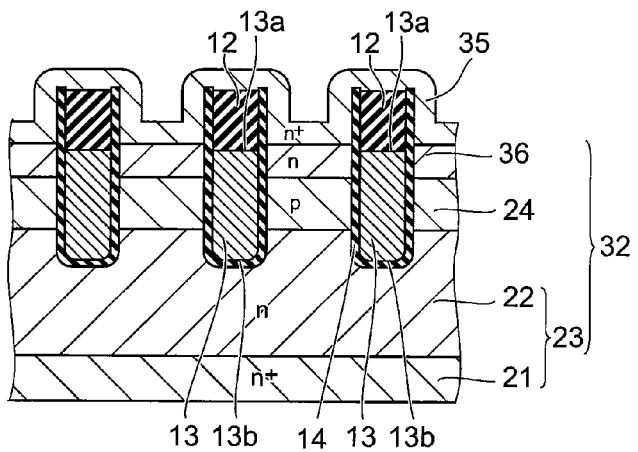

Next, as shown in FIG. 5C, by heat treatment, the phosphorus contained in the impurity-containing film 35 is diffused into the base layer 24. Thus, the upper layer portion of the base layer 24 is changed in conductivity type from p-type to n-type to constitute an n-type layer 36. The lower surface of the n-type layer 36 is positioned below the upper end 13a of the gate electrode 13.

At this time, the effective impurity concentration of the n-type layer 36 is made lower than the effective impurity concentration of the impurity-containing film 35. Furthermore, the diffusion velocity of phosphorus in monocrystalline silicon is lower than the diffusion velocity of phosphorus in polycrystalline silicon. Hence, at the interface between the impurity-containing film 35 and the n-type layer 36, the concentration of phosphorus discontinuously changes. Furthermore, in the n-type layer 36, the concentration of phosphorus decreases with the distance from the impurity-containing film 35, i.e., decreases downward.

Figure 6A:
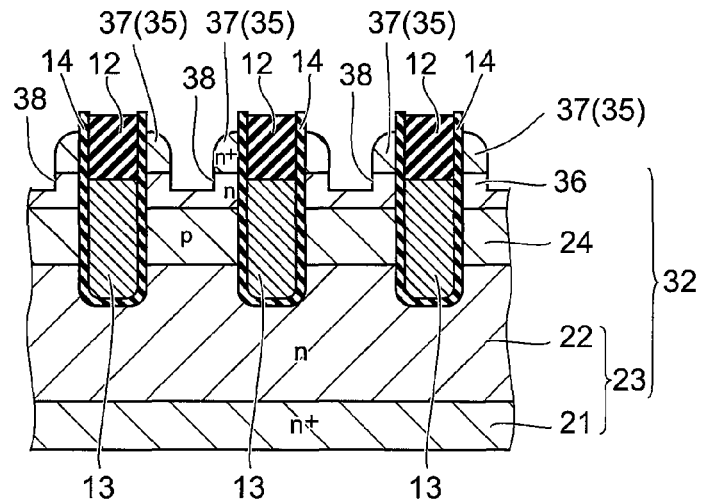
FIGS. 6A to 6C are process sectional views illustrating the method for manufacturing a semiconductor device according to the first embodiment.

Next, as shown in FIG. 6A, anisotropic etching is performed from above. Thus, in the impurity-containing film 35, the portion formed on the upper surface of the semiconductor substrate 32 and the portion formed on the upper surface of the structural body made of the insulating member 12 and the gate insulating film 14 are removed. At this time, the portion of the impurity-containing film 35 formed on the side surface of the structural body made of the insulating member 12 and the gate insulating film 14 remains as a sidewall 37. Then, the anisotropic etching is continued. Thus, in the upper portion of the n-type layer 36, the portion except immediately below the sidewall 37 is removed. Accordingly, a source trench 38 is formed.

Figure 6B:
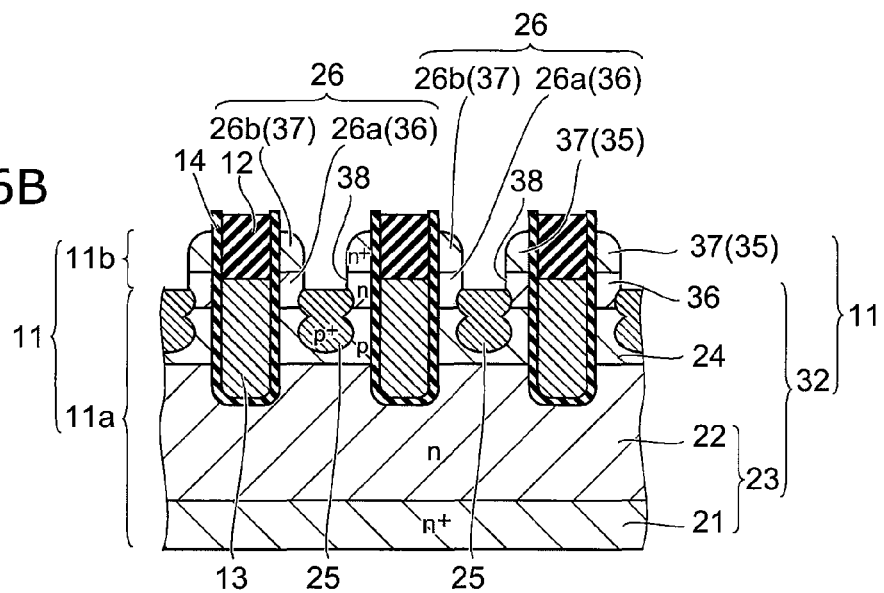

Next, as shown in FIG. 6B, the sidewall 37, i.e., the remaining portion of the impurity-containing film 35, is used as a mask to ion-implant acceptor impurity such as boron into the semiconductor substrate 32. Thus, in the portion of the n-type layer 36 and the base layer 24 between the immediately underlying regions of the sidewalls 37, a carrier ejection layer 25 having p-type conductivity and having a higher effective impurity concentration than the base layer 24 is formed. For instance, by ion-implanting boron at two levels of acceleration voltage, the carrier ejection layer 25 is shaped like two vertically joined oval cylinders. Here, the impurity-containing film 35 has been doped with phosphorus at approximately $1 \times 10^{21}$ cm$^{-3}$. The amount of boron implanted in this step is approximately $1 \times 10^{19}$ cm$^{-3}$. Hence, this boron implantation does not change the conductivity type of the impurity-containing film 35 from n-type to p-type.

At this time, in the n-type layer 36, the portion remaining in the n-type conductivity, i.e., the portion immediately below the sidewall 37, constitutes the lower section 26$a$ of a source layer 26. On the other hand, the sidewall 37, i.e., the remaining portion of the impurity-containing film 35, constitutes the upper section 26$b$ of the source layer 26. The remaining portion of the semiconductor substrate 32 formed from monocrystalline silicon and the remaining portion of the impurity-containing film 35 formed from polycrystalline silicon are collectively referred to as a semiconductor substrate member 11. In the semiconductor substrate member 11, the portion located below the bottom surface of the source trench 38 is referred to as a main body 11$a$, and the portion located thereabove is referred to as an elongated projection 11$b$.

Figure 6C:
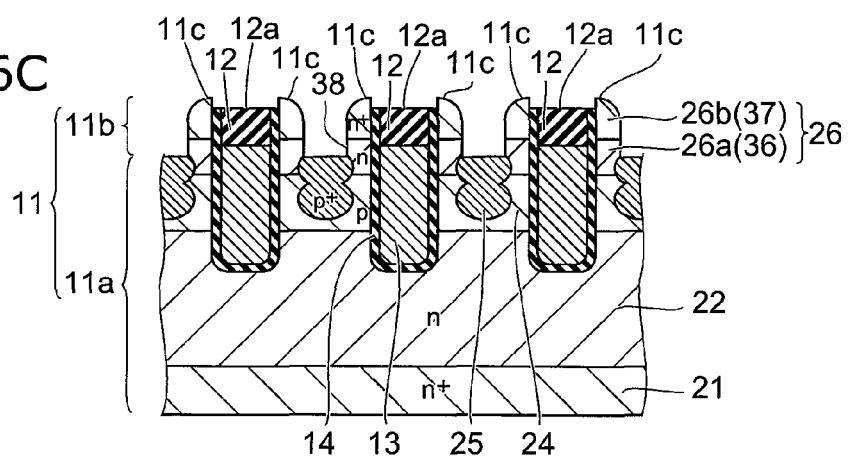

Next, as shown in FIG. 6C, etch-back is performed under a condition such that silicon oxide is selectively etched relative to silicon. Thus, the upper portion of the insulating member 12 and the gate insulating film 14 is removed. Accordingly, the upper surface 12$a$ of the insulating member 12 is set back to below the upper end portion of the sidewall 37, i.e., the upper end 11$c$ of the elongated projection 11$b$.

Next, as shown in FIG. 1, a barrier metal film 16 is formed so as to cover the upper surface of the semiconductor substrate member 11. The barrier metal film 16 extends into the source trench 38 and is brought into contact with the upper surface of the carrier ejection layer 25. Furthermore, the barrier metal film 16 is brought into contact with the entire exposed surface of the source layer 26. Furthermore, the barrier metal film 16 is also brought into contact with the upper surface 12$a$ of the insulating member 12 and the upper end surface of the gate insulating film 14. Next, a metal film 17 is formed on the barrier metal film 16. The barrier metal film 16 and the metal film 17 constitute a source electrode 18. On the other hand, on the lower surface of the semiconductor substrate member 11, a drain electrode 19 is formed. The drain electrode 19 is brought into contact with the entirety of the lower surface of the semiconductor substrate member 11, i.e., the lower surface of the silicon substrate 21. Thus, the semiconductor device 1 is manufactured.

In this embodiment, in the step shown in FIG. 3A, a gate trench 15 is formed in the semiconductor substrate 32. In the step shown in FIG. 4B, a gate electrode 13 and an insulating member 12 are formed in the gate trench 15. In the step shown in FIG. 4C, by setting back the upper surface of the semiconductor substrate 32, the insulating member 12 is projected. In the step shown in FIG. 6A, a sidewall 37 is formed on the side surface of the projected insulating member 12. In the step shown in FIG. 6B, the sidewall 37 is used as a mask to perform ion implantation to form a carrier ejection layer 25.

Thus, according to this embodiment, once the gate trench 15 is formed by the lithography method, the carrier ejection layer 25 is formed in a self-alignment procedure. The distance between the gate trench 15 and the carrier ejection layer 25 can be determined by the film thickness of the impurity-containing film 35. As a result, despite variation in the process condition, the distance between the gate trench 15 and the carrier ejection layer 25 can be kept constant between all the MOSFETs. Thus, the characteristics of the MOSFETs can be made uniform. Accordingly, the integration density of the semiconductor device 1 according to this embodiment can be easily increased. By increasing the integration density of the semiconductor device 1, the on-resistance can be reduced.

In contrast, if the gate trench 15 and the carrier ejection layer 25 are formed by separate lithography steps, misalignment inevitably occurs between the gate trench 15 and the carrier ejection layer 25. If the carrier ejection layer 25 is displaced from the gate trench 15, the characteristics of the MOSFET are varied. For instance, the thresholds of two MOSFETs formed on both sides of the carrier ejection layer 25 are made different from each other. Thus, even if an on-potential is applied to the gate electrode 13, one of the MOSFETs may fail to be turned on. Furthermore, if the distance between the gate trenches 15 is made shorter, the misalignment between the gate trench 15 and the carrier ejection layer 25 is made relatively larger. This makes it difficult to reduce the distance between the gate trenches 15. This results in hampering the increase of integration density of the semiconductor device.

Furthermore, in this embodiment, in the step shown in FIG. 5B, an impurity-containing film 35 containing phosphorus at high concentration is formed. In the step shown in FIG. 5C, the phosphorus contained in the impurity-containing film 35 is diffused into the base layer 24 to form an n-type layer 36. Then, after the anisotropic etching shown in FIG. 6A, the remaining portion of the impurity-containing film 35 constitutes the upper section 26$b$ of a source layer 26, and the remaining portion of the n-type layer 36 constitutes the lower section 26$a$ of the source layer 26. Thus, while the phosphorus concentration of the lower section 26$a$ of the source layer 26 is maintained at a prescribed value suitable for the MOSFET, the phosphorus concentration of the upper section 26$b$ of the source layer 26 can be increased. Thus, the contact resistance to the source electrode 18 can be reduced. By suppressing the phosphorus concentration of the lower section 26$a$ of the source layer 26, the impurity concentration in the channel region, i.e., near the gate insulating film 14 in the base layer 24, is suppressed. Thus, the avalanche withstand capability can be improved.

In particular, by using the phosphorus deposition process, the impurity-containing film 35 can be efficiently doped with phosphorus. Furthermore, the impurity-containing film 35 is formed from polycrystalline silicon, and the base layer 24 is formed from monocrystalline silicon. Thus, by using the difference between the diffusion velocity of phosphorus in polycrystalline silicon and the diffusion velocity of phosphorus in monocrystalline silicon, the phosphorus concentration of the impurity-containing film 35 and the phosphorus concentration of the n-type layer 36 can be made significantly different in a discontinuous manner. Thus, the aforementioned effect is made more prominent.

In contrast, if the boron implantation into the source layer 26 is performed by a single ion implantation, then as indicated by dashed line L2 in FIG. 2, the phosphorus concentration in the source layer 26 continuously changes in the vertical direction. In this case, if the phosphorus concentration of the lower section 26a of the source layer 26 is suppressed to ensure sufficient avalanche withstand capability, the phosphorus concentration of the upper section 26b cannot be significantly increased, either. Thus, the contact resistance to the source electrode 18 is made higher.

Furthermore, in this embodiment, in the step shown in FIG. 6A, by anisotropic etching, the portion of the impurity-containing film 35 formed on the upper surface of the semiconductor substrate 32 is removed. Thus, in the step shown in FIG. 6B, boron can be efficiently implanted into the upper layer portion of the base layer 24. As a result, the sustaining capability of the semiconductor device 1 is improved. Furthermore, also after the impurity-containing film 35 is removed from above the upper surface of the semiconductor substrate 32, the anisotropic etching is continued. Thus, the source trench 38 can be formed in a self-aligned manner without addition of a new step. By forming the source trench 38, the contact resistance between the source electrode 18 and the source layer 26 can be reduced.

Furthermore, in this embodiment, in the step shown in FIG. 6B, the upper portion of the insulating member 12 is removed. Thus, the upper surface 12a of the insulating member 12 is positioned below the upper end portion of the sidewall 37. This reduces the aspect ratio of the source trench 38 and the space between the sidewalls 37 and the like immediately thereabove. Thus, in the step shown in FIG. 1, burying of the barrier metal film 16 is facilitated.

Moreover, in this embodiment, the upper surface 12a of the insulating member 12 is located below the upper end portion of the sidewall 37, i.e., the upper end portion of the source layer 26. Thus, between the source layer 26 and the barrier metal film 16, the contact area is made larger, and the contact resistance is made lower.

Moreover, in this embodiment, in the step shown in FIG. 4C, the upper surface 32a of the semiconductor substrate 32 is positioned above the upper end portion 13a of the gate electrode 13. Thus, no overlap occurs in the vertical direction between the lower section 26a of the source layer 26 doped with phosphorus at high concentration and the gate electrode 13. As a result, even if the gate insulating film 14 is subsequently damaged by e.g. wet etching, a short circuit between the source layer 26 and the gate electrode 13 is made less likely to occur, and the breakdown voltage is increased. Furthermore, the capacitance between the source layer 26 and the gate electrode 13 can also be reduced.

In the example illustrated in this embodiment, the upper section 26b of the source layer 26 is formed from polycrystalline silicon. However, this embodiment is not limited thereto. For instance, the upper section 26b may be formed from epitaxially grown silicon. Furthermore, in the example illustrated in this embodiment, the impurity-containing film 35 is formed by the phosphorus deposition process. However, this embodiment is not limited thereto. For instance, the impurity-containing film 35 may be formed by depositing polycrystalline silicon and then ion-implanting phosphorus.

Furthermore, in the example illustrated in this embodiment, in the step shown in FIG. 5C, the lower section 26a of the source layer 26 is formed by diffusing impurity from the impurity-containing film 35 into the base layer 24. However, this embodiment is not limited thereto. For instance, the lower section 26a may be formed by ion-implanting impurity into the upper layer portion of the base layer 24 before depositing polycrystalline silicon for forming the upper section 26b. Then, also in the case where the sidewall 37 (upper section 26b) is formed from epitaxial silicon, silicide, or metal material, the lower section 26a can be reliably doped with impurity. In particular, in the case where the sidewall is formed from not silicide but pure metal, it is difficult to diffuse impurity from this sidewall. Then, it is necessary to ion-implant and diffuse impurity before forming the sidewall. These also apply to the other embodiments described later.

Figure 7:
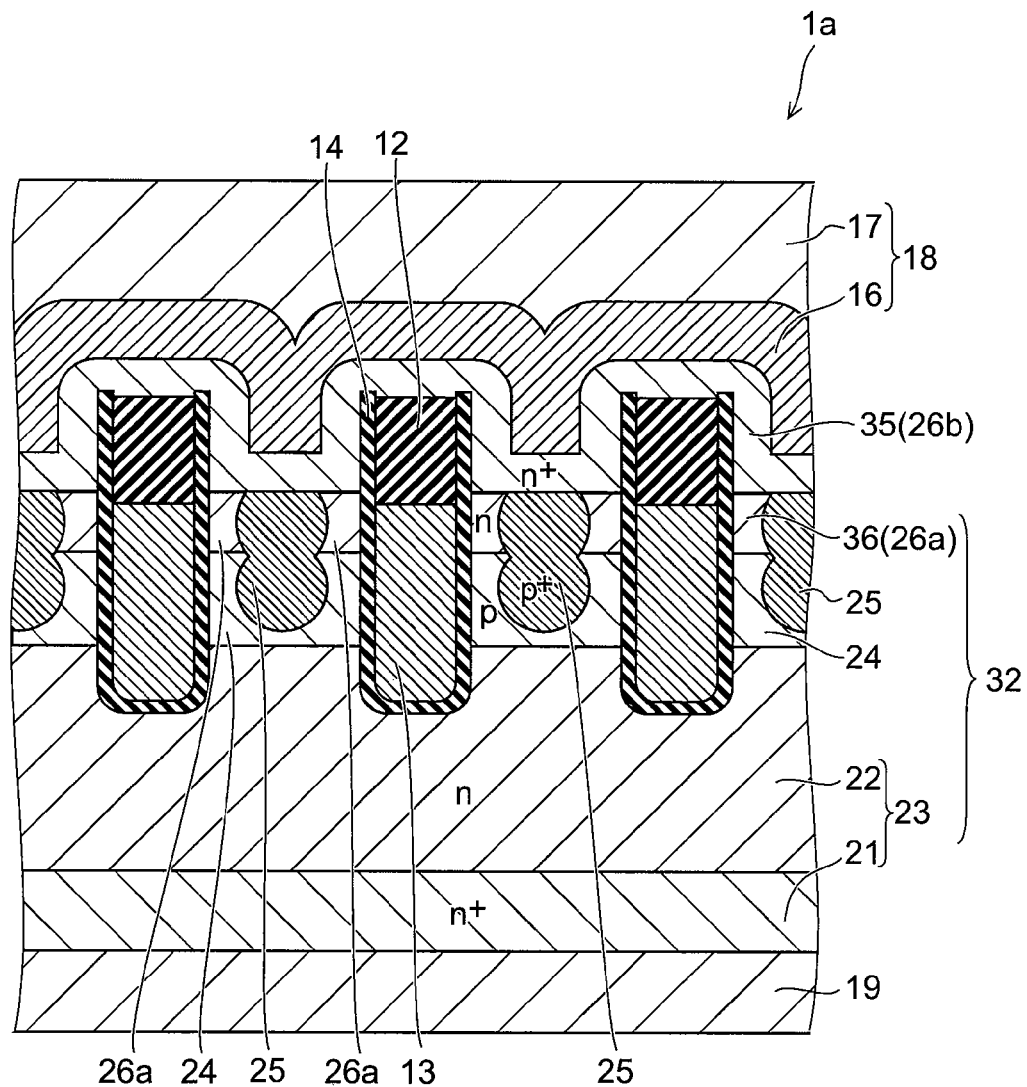
FIG. 7 is a sectional view illustrating a semiconductor device according to a first variation of the first embodiment.

Next, a first variation of the first embodiment is described.
FIG. 7 is a sectional view illustrating a semiconductor device according to this variation.

As shown in FIG. 7, the semiconductor device 1a according to this variation is different from the semiconductor device 1 (see FIG. 1) according to the above first embodiment in that the impurity-containing film 35 is not processed into the sidewall 37 (see FIG. 1), but remains as a continuous film on the upper surface of the semiconductor substrate 32 so as to cover the projected portion of the insulating member 12. Thus, the insulating member 12 is buried in the semiconductor substrate member 11, and the upper portion of the insulating member 12 is placed in the elongated projection of the semiconductor substrate member 11. The source electrode 18 is connected to the carrier ejection layer 25 via the impurity-containing film 35. Here, in the semiconductor device 1a, the drain electrode 19 serves as a positive electrode, and the source electrode 18 serves as a negative electrode. Hence, the pn interface of the p-type carrier ejection layer 25 and the n-type impurity-containing film 35 constitutes a forward junction, and does not block electrical conduction. Furthermore, in the semiconductor device 1a, the source trench 38 (see FIG. 1) is not formed. The configuration of this variation other than the foregoing is similar to that of the above first embodiment.

Next, a method for manufacturing a semiconductor device according to this variation is described.

Figure 8:
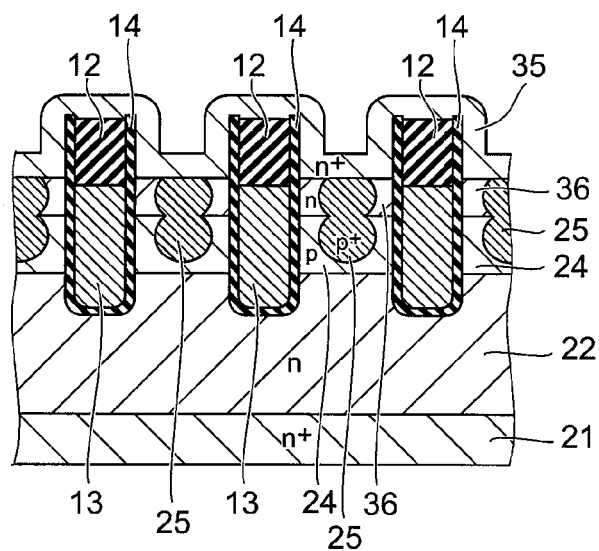
FIG. 8 is a process sectional view illustrating the method for manufacturing a semiconductor device according to the first variation of the first embodiment.

FIG. 8 is a process sectional view illustrating the method for manufacturing a semiconductor device according to this variation.

First, similarly to the above first embodiment, the steps shown in FIGS. 3A to 5C are performed.

Next, as shown in FIG. 8, without etching back the impurity-containing film 35, acceptor impurity such as boron is ion-implanted across the impurity-containing film 35. In this case, the acceleration voltage of ion implantation is made higher than in the above first embodiment. At this time, in the impurity-containing film 35, the portion formed on the side surface of the insulating member 12 is longer in vertical length than the portion formed on the upper surface of the semiconductor substrate 32, and hence functions as a mask. As a result, a carrier ejection layer 25 is formed in the portion of the n-type layer 36 and the base layer 24 spaced by the film thickness of the impurity-containing film 35 from the gate trench 15. Here, the impurity-containing film 35 has been doped with phosphorus at approximately $1 \times 10^{21}$ cm$^{-3}$. The amount of boron implanted in the step shown in FIG. 8 is approximately $1 \times 10^{19}$ cm$^{-3}$. Hence, the conductivity type of the impurity-containing film 35 is not changed from n-type to p-type. Subsequently, a source electrode 18 and a drain electrode 19 are formed. Thus, the semiconductor device 1a according to this variation is manufactured. The manufacturing method of this variation other than the foregoing is similar to that of the above first embodiment.

In this variation, the impurity-containing film 35 constitutes the upper section 26b of the source layer 26. Furthermore, the entire upper surface of the impurity-containing film 35 is in contact with the source electrode 18. Thus, between the source electrode 18 and the source layer 26, the contact area is large, and the contact resistance is small.

Furthermore, the portion of the impurity-containing film 35 formed on the side surface of the insulating member 12 is used as a mask to ion-implant boron. Thus, the carrier ejection layer 25 can be formed in a self-aligned manner.

Furthermore, similarly to the above first embodiment, the phosphorus contained in the impurity-containing film 35 is diffused into the base layer 24 to form an n-type layer 36. Thus, the impurity concentration of the upper section 26b of the source layer 26 can be increased to reduce the contact resistance to the source electrode 18, and the impurity concentration of the lower section 26a can be suppressed to improve the avalanche withstand capability. Moreover, the impurity-containing film 35 and the gate electrode 13 are vertically spaced. Thus, between the source layer 26 and the gate electrode 13, a short circuit can be prevented, and the capacitance can be reduced.

Next, a second variation of the first embodiment is described.

Figure 9:
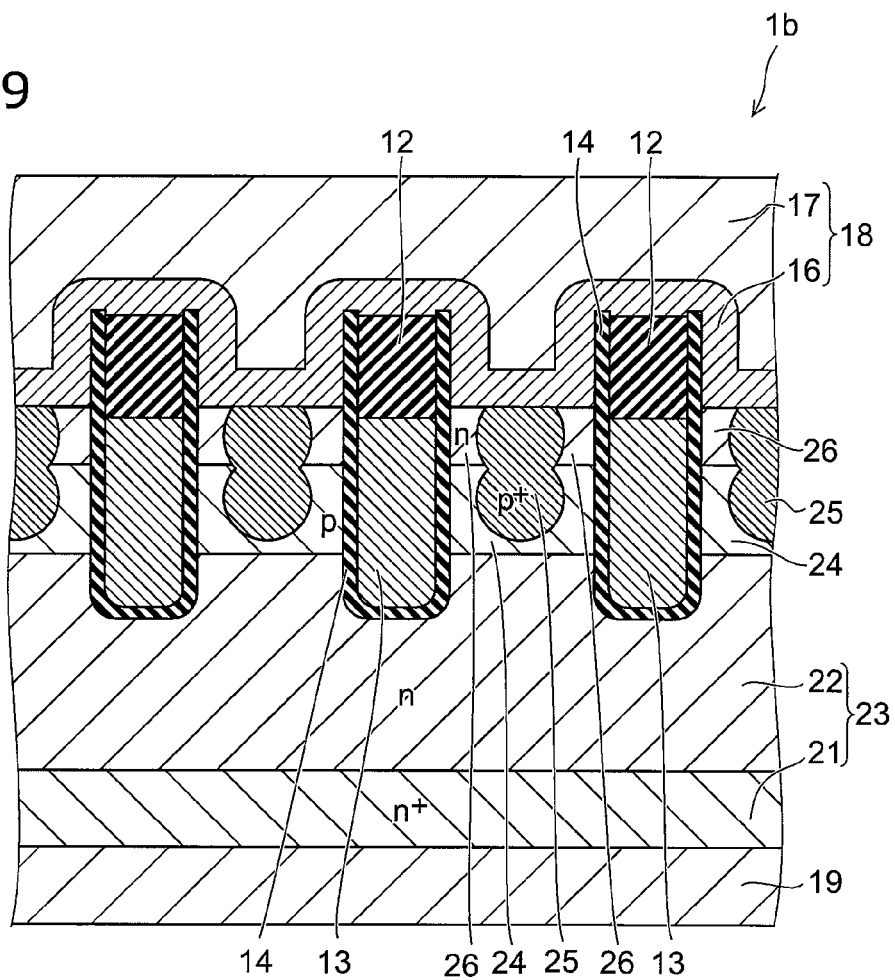
FIG. 9 is a sectional view illustrating a semiconductor device according to a second variation of the first embodiment.

FIG. 9 is a sectional view illustrating a semiconductor device according to this variation.

As shown in FIG. 9, the semiconductor device 1b according to this variation is different from the semiconductor device 1a (see FIG. 7) according to the above first variation in that the impurity-containing film 35 (see FIG. 7) is not provided. Another difference is that the phosphorus contained in the source layer 26 is doped not by diffusion from the impurity-containing film 35 (see FIG. 7) but by ion implantation. Thus, the phosphorus concentration profile in the source layer 26 is different from the profile (see FIG. 2) in the above first embodiment. For instance, as indicated by dashed line L2 in FIG. 2, one or more peaks occur in the vertically central portion of the source layer 26. The configuration of this variation other than the foregoing is similar to that of the above first variation.

Next, a method for manufacturing a semiconductor device according to this variation is described.

Figure 10A:
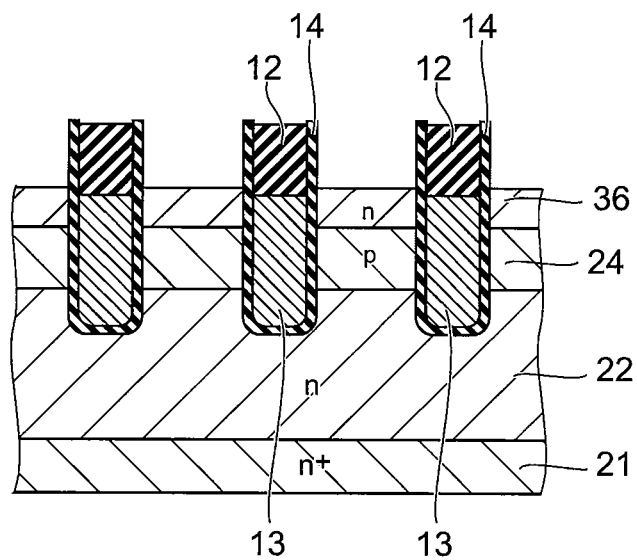
FIGS. 10A to 10C are process sectional views illustrating the method for manufacturing a semiconductor device according to the second variation of the first embodiment.
Figure 10B:
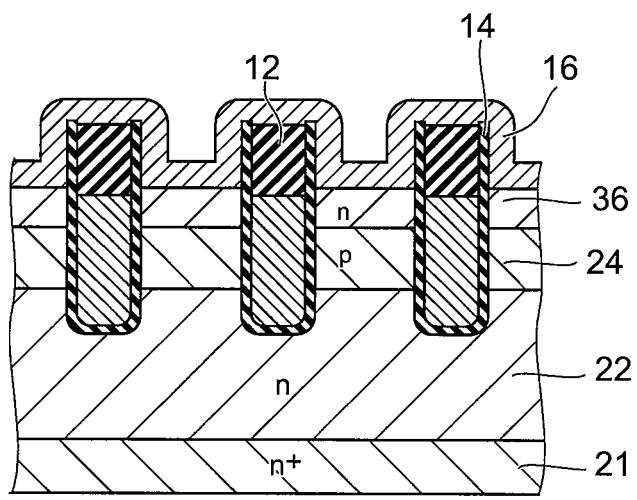
Figure 10C:
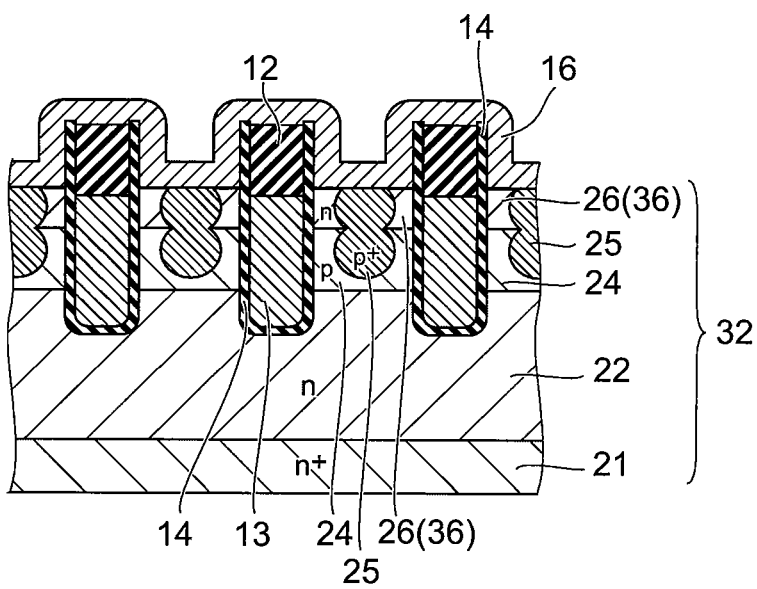

FIGS. 10A to 10C are process sectional views illustrating the method for manufacturing a semiconductor device according to this variation.

First, similarly to the above first embodiment, the steps shown in FIGS. 3A to 5A are performed.

Next, as shown in FIG. 10A, by ion implantation, an upper portion of the base layer 24 is doped with donor impurity such as phosphorus. Thus, the upper layer portion of the base layer 24 with the lower surface located below the upper end 13a of the gate electrode 13 is changed in conductivity type from p-type to n-type to constitute an n-type layer 36.

Next, as shown in FIG. 10B, a barrier metal film 16 is formed on the entire surface. The barrier metal film 16 is formed so as to cover also the portion of the insulating member 12 projected from the upper surface of the semiconductor substrate 32.

Next, as shown in FIG. 10C, acceptor impurity such as boron is ion-implanted across the barrier metal film 16. At this time, in the barrier metal film 16, the portion formed on the side surface of the insulating member 12 is longer in vertical length than the portion formed on the upper surface of the semiconductor substrate 32, and hence functions as a mask.

As a result, a carrier ejection layer 25 is formed in the portion of the n-type layer 36 and the base layer 24 spaced by the film thickness of the barrier metal film 16 from the gate trench 15. Subsequently, a source electrode 18 and a drain electrode 19 are formed. Thus, the semiconductor device 1b according to this variation is manufactured. The manufacturing method of this variation other than the foregoing is similar to that of the above first variation.

In this variation, the portion of the barrier metal film 16 formed on the side surface of the insulating member 12 is used as a mask. Thus, the carrier ejection layer 25 can be formed in a self-aligned manner.

Next, a second embodiment is described.

Figure 11:
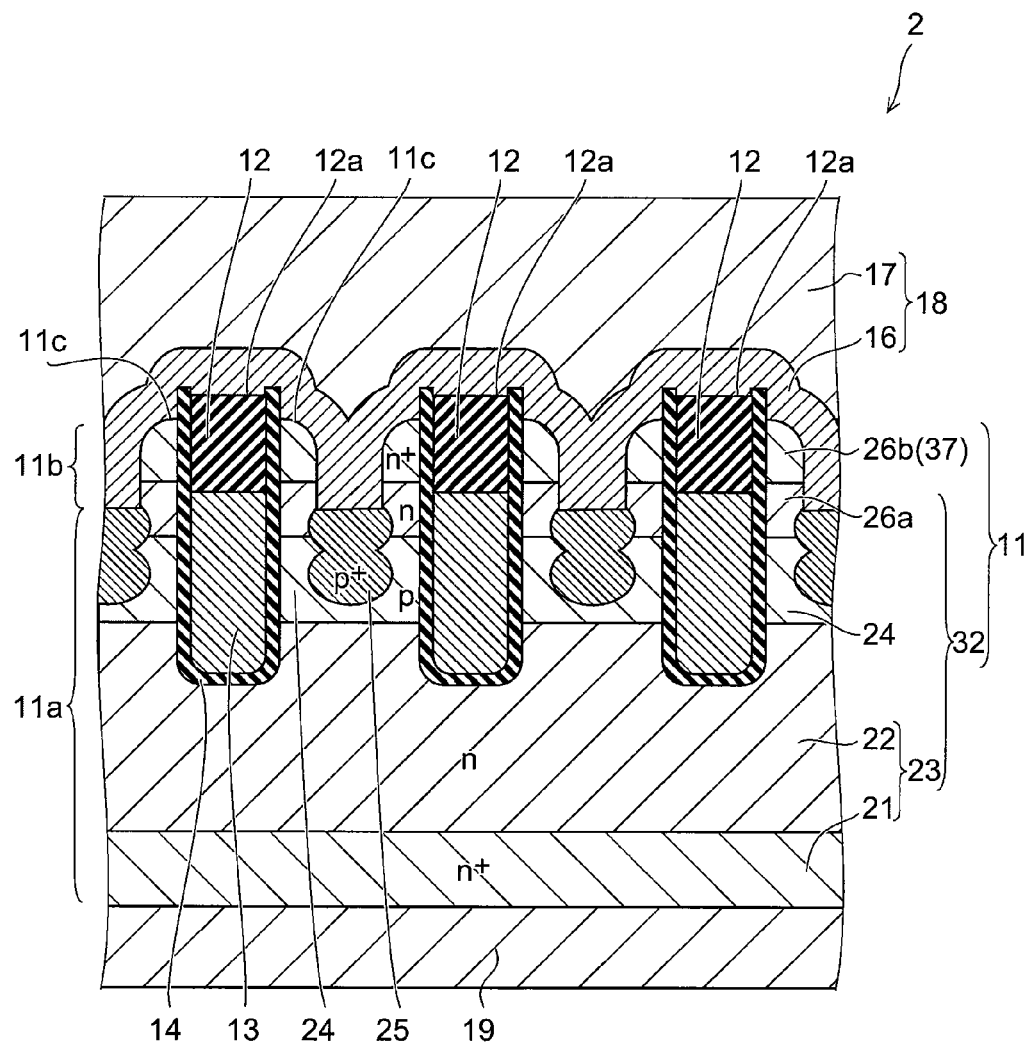
FIG. 11 is a sectional view illustrating a semiconductor device according to a second embodiment.

FIG. 11 is a sectional view illustrating a semiconductor device according to this embodiment.

As shown in FIG. 11, the semiconductor device 2 according to this embodiment is different from the semiconductor device 1 (see FIG. 1) according to the above first embodiment in that the upper surface 12a of the insulating member 12 is located above the upper end 11c of the elongated projection 11b. Such a semiconductor device 2 is manufactured as follows. Similarly to the above first embodiment, the steps shown in FIGS. 3A to 6B are performed. Then, without performing the step for removing the upper portion of the insulating member 12 shown in FIG. 6C, a source electrode 18 and a drain electrode 19 are formed. The configuration and manufacturing method of this embodiment other than the foregoing are similar to those of the above first embodiment.

Also in this embodiment, similarly to the above first embodiment, by using the sidewall 37, the carrier ejection layer 25 can be formed in a self-aligned manner with respect to the gate trench 15. Furthermore, the phosphorus contained in the impurity-containing film 35 is diffused into the base layer 24 to form an n-type layer 36. Thus, the impurity concentration of the upper section 26b of the source layer 26 can be increased to reduce the contact resistance to the source electrode 18, and the impurity concentration of the lower section 26a can be suppressed to improve the avalanche withstand capability. Furthermore, the portion of the impurity-containing film 35 formed on the upper surface of the semiconductor substrate 32 is removed. Thus, boron can be efficiently implanted. Furthermore, the source trench 38 can be formed in a self-aligned manner without addition of a new step. Moreover, the upper section 26b of the source layer 26 and the gate electrode 13 are vertically spaced. Thus, between the source layer 26 and the gate electrode 13, a short circuit can be prevented, and the capacitance can be reduced.

Next, a third embodiment is described.

Figure 12:
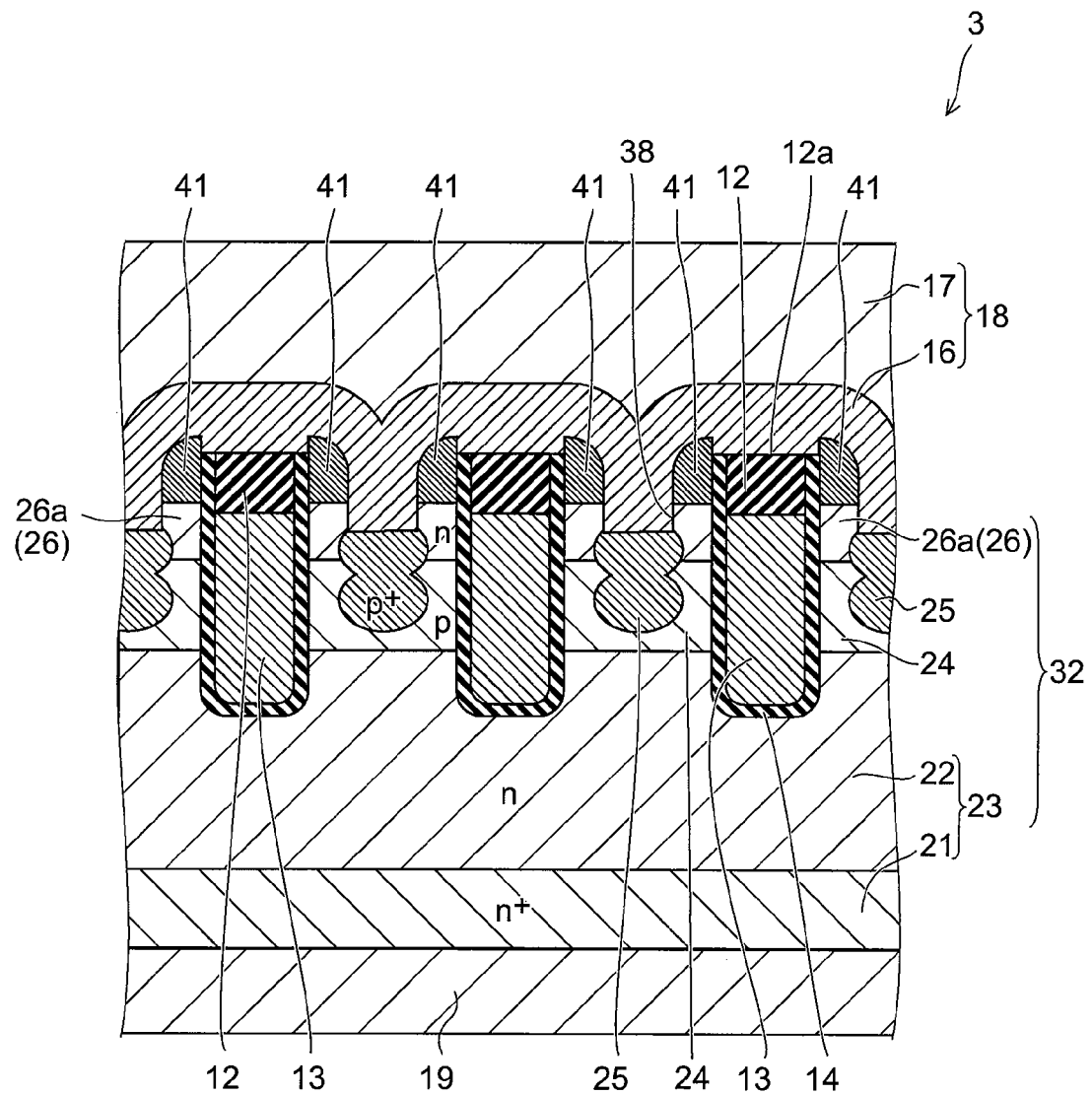
FIG. 12 is a sectional view illustrating a semiconductor device according to a third embodiment.

FIG. 12 is a sectional view illustrating a semiconductor device according to this embodiment.

As shown in FIG. 12, the semiconductor device 3 according to this embodiment is different from the semiconductor device 1 (see FIG. 1) according to the above first embodiment in that the upper section 26b (see FIG. 1) of the source layer 26, i.e., the sidewall 37 (see FIG. 1), is not provided, but instead, a sidewall 41 made of silicide is provided. In the semiconductor device 3, the source layer 26 consists only of the lower section 26a.

Furthermore, the effective impurity concentration of the source layer 26 is lower than the effective impurity concentration of the sidewall 41 (silicide film 43). In the impurity concentration profile along the vertical direction in the sidewall 41 and the source layer 26, the impurity concentration discontinuously changes at the interface between the sidewall 41 and the source layer 26. The shape of this impurity concentration profile is similar to the profile shown in FIG. 2. In this case, the "upper section 26b" shown in FIG. 2 is replaced by the "sidewall 41". The configuration of this embodiment other than the foregoing is similar to that of the above first embodiment.

Next, a method for manufacturing a semiconductor device according to this embodiment is described.

Figure 13A:
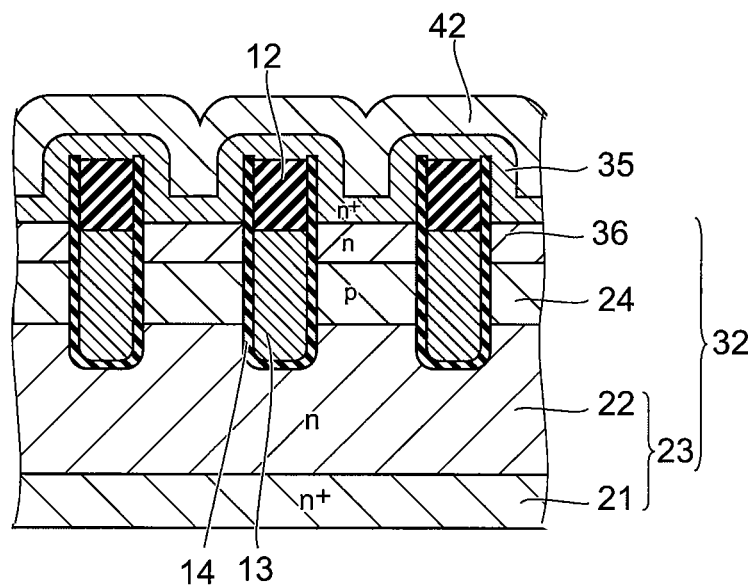
FIGS. 13A to 13C are process sectional views illustrating the method for manufacturing a semiconductor device according to the third embodiment.
Figure 13B:
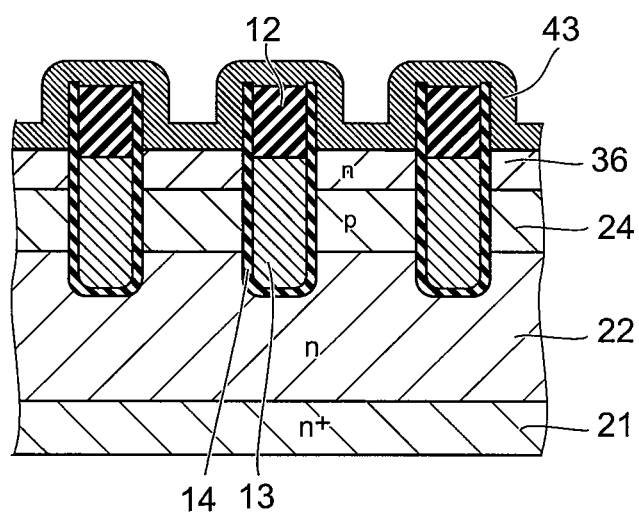
Figure 13C:
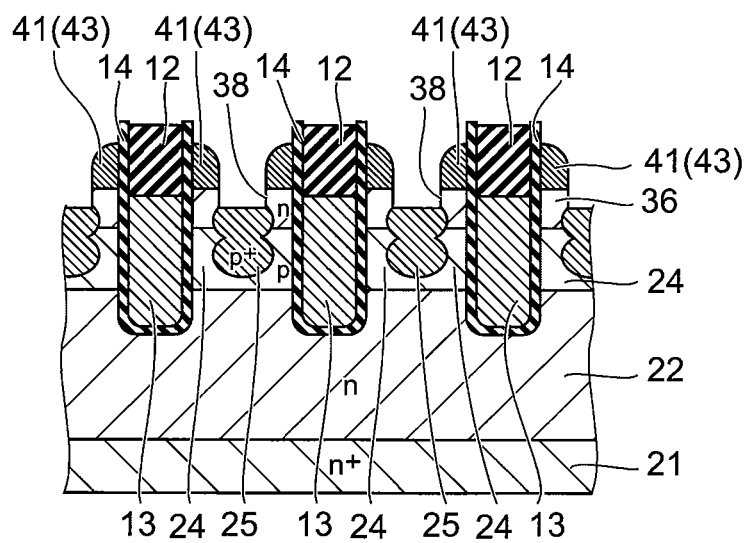

FIGS. 13A to 13C are process sectional views illustrating the method for manufacturing a semiconductor device according to this embodiment.

First, similarly to the above first embodiment, the steps shown in FIGS. 3A to 5C are performed.

Next, as shown in FIG. 13A, on the impurity-containing film 35, a metal film 42 made of e.g. titanium or tungsten is formed.

Next, as shown in FIG. 13B, heat treatment is performed to cause silicidation reaction between the silicon contained in the impurity-containing film 35 and the metal contained in the metal film 42. Thus, the impurity-containing film 35 is changed to a silicide film 43. Next, from above the silicide film 43, the unreacted metal film 42 is removed.

The subsequent process is similar to that of the above first embodiment. More specifically, as shown in FIG. 13C, anisotropic etching is performed from above. Thus, in the silicide film 43, the portion formed on the upper surface of the semiconductor substrate 32 and the portion formed on the upper surface of the structural body made of the insulating member 12 and the gate insulating film 14 are removed. At this time, the portion of the silicide film 43 formed on the side surface of the structural body made of the insulating member 12 and the gate insulating film 14 remains as a sidewall 41. Then, the anisotropic etching is continued. Thus, a source trench 38 is formed. Next, the sidewall 41 is used as a mask to ion-implant acceptor impurity such as boron. Thus, in the portion of the n-type layer 36 and the base layer 24 between the immediately underlying regions of the sidewalls 41, a carrier ejection layer 25 is formed.

Next, similarly to the step shown in FIG. 6C, the upper portion of the insulating member 12 is removed. Thus, the upper surface 12a of the insulating member 12 is located below the upper end of the sidewall 41.

Next, as shown in FIG. 12, a source electrode 18 and a drain electrode 19 are formed. Here, the source electrode 18 is brought into contact with the sidewall 41 made of silicide. Thus, the semiconductor device 3 according to this embodiment is manufactured. The manufacturing method of this embodiment other than the foregoing is similar to that of the above first embodiment.

In this embodiment, the sidewall 41 made of silicide is interposed between the source electrode 18 and the source layer 26. Thus, the resistance between the source electrode 18 and the source layer 26 can be further reduced. Furthermore, also in this embodiment, similarly to the above first embodiment, by using the sidewall 41, the carrier ejection layer 25 can be formed in a self-aligned manner. Furthermore, the portion of the silicide film 43 formed on the upper surface of the semiconductor substrate 32 is removed. Thus, boron can be efficiently implanted. Furthermore, the source trench 38 can be formed in a self-aligned manner without addition of a new step. Moreover, the sidewall 41 and the gate electrode 13 are vertically spaced. Thus, between the source layer 26 and the gate electrode 13, a short circuit can be prevented, and the capacitance can be reduced.

Next, a variation of the third embodiment is described.

Figure 14:
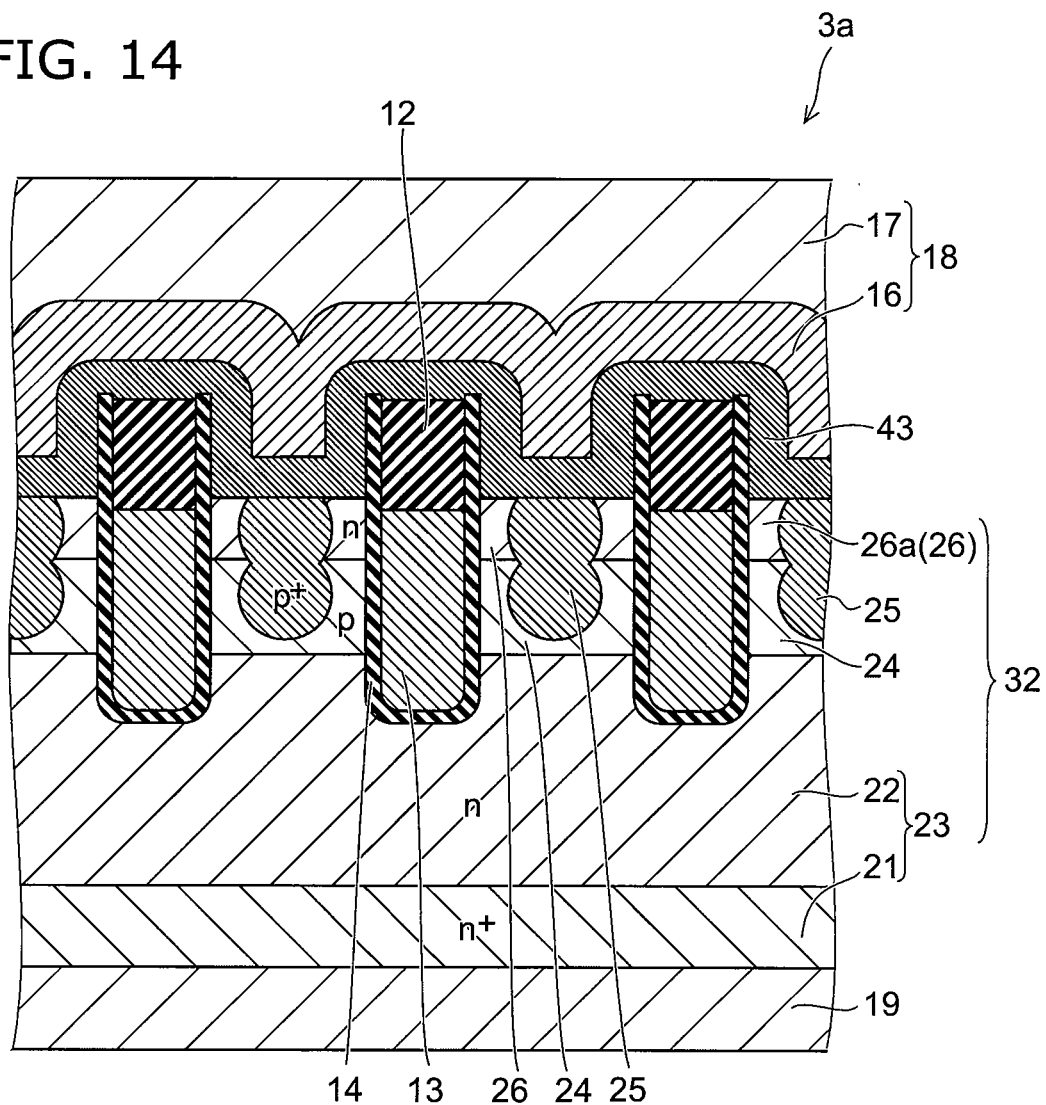
FIG. 14 is a sectional view illustrating a semiconductor device according to a variation of the third embodiment.

FIG. 14 is a sectional view illustrating a semiconductor device according to this variation.

As shown in FIG. 14, the semiconductor device 3a according to this variation is different from the semiconductor device 3 (see FIG. 12) according to the above third embodiment in that the silicide film 43 is not processed into the sidewall 41 (see FIG. 12), but remains as a continuous film on the upper surface of the semiconductor substrate 32 so as to cover the upper surface of the insulating member 12. Thus, the source electrode 18 is connected to the source layer 26 and the carrier ejection layer 25 via the silicide film 43. Furthermore, in the semiconductor device 3a, the source trench 38 (see FIG. 12) is not formed. The configuration of this variation other than the foregoing is similar to that of the above third embodiment.

Next, a method for manufacturing a semiconductor device according to this variation is described.

Figure 15:
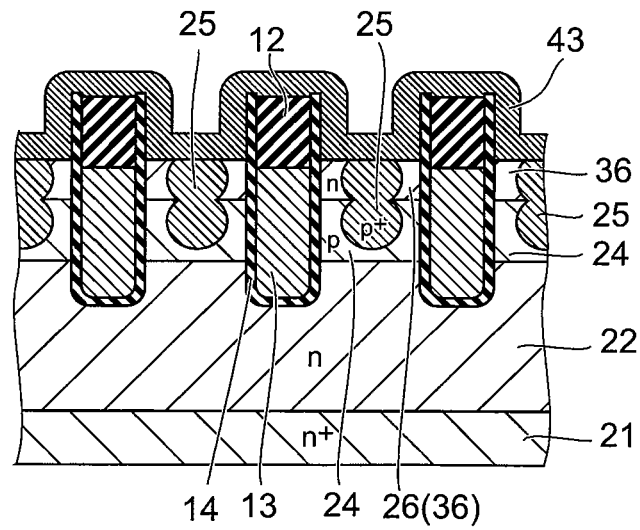
FIG. 15 is a process sectional view illustrating the method for manufacturing a semiconductor device according to the variation of the third embodiment.

FIG. 15 is a process sectional view illustrating the method for manufacturing a semiconductor device according to this variation.

First, similarly to the above third embodiment, the steps shown in FIGS. 3A to 5C and FIGS. 9A and 9B are performed.

Next, as shown in FIG. 15, without etching back the silicide film 43, acceptor impurity such as boron is ion-implanted across the silicide film 43. The acceleration voltage of this ion implantation is made higher than the acceleration voltage of the ion implantation of boron (see FIG. 6B) in the above first embodiment. At this time, in the silicide film 43, the portion formed on the side surface of the insulating member 12 is longer in vertical length, i.e., the length in the ion implantation direction, than the portion formed on the upper surface of the semiconductor substrate 32, and hence functions as a mask. As a result, in the portion of the n-type layer 36 and the base layer 24 spaced by the film thickness of the silicide film 43 from the gate trench 15, boron is implanted via the silicide film 43, and a carrier ejection layer 25 is formed. Subsequently, a source electrode 18 and a drain electrode 19 are formed. Thus, the semiconductor device 3a according to this variation is manufactured. The manufacturing method of this variation other than the foregoing is similar to that of the above third embodiment.

Also in this variation, the portion of the silicide film 43 formed on the side surface of the insulating member 12 is used as a mask to ion-implant boron. Thus, the carrier ejection layer 25 can be formed in a self-aligned manner. Furthermore, the silicide film 43 and the gate electrode 13 are vertically spaced. Thus, between the source layer 26 and the gate electrode 13, a short circuit can be prevented, and the capacitance can be reduced.

Next, a fourth embodiment is described.

Figure 16:
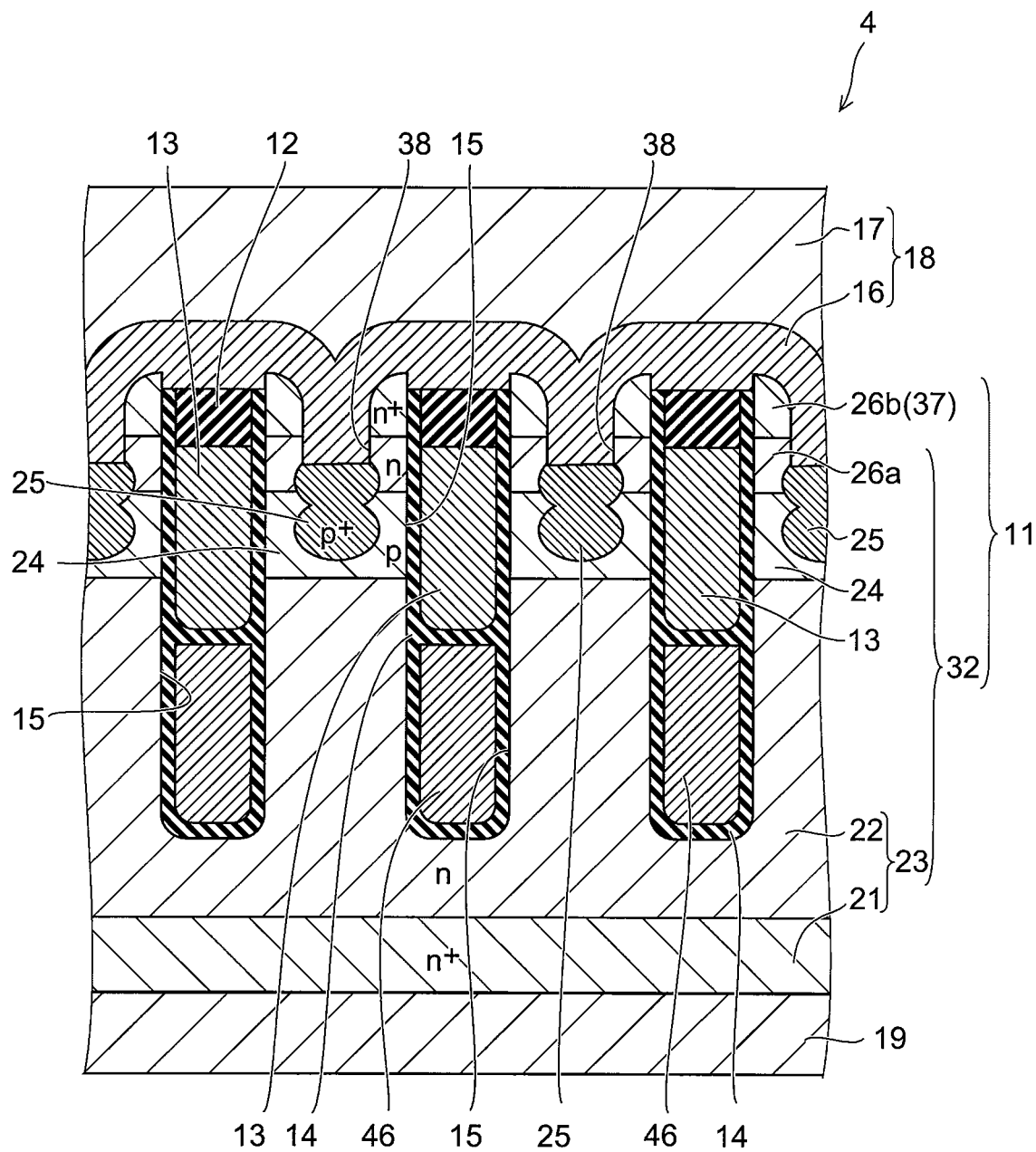
FIG. 16 is a sectional view illustrating a semiconductor device according to a fourth embodiment.

FIG. 16 is a sectional view illustrating a semiconductor device according to this embodiment.

As shown in FIG. 16, the semiconductor device 4 according to this embodiment is different from the semiconductor device 1 (see FIG. 1) according to the above first embodiment in that a buried electrode 46 is provided immediately below the gate electrode 13 in the gate trench 15. The buried electrode 46 is made of a conductive material such as polycrystalline silicon doped with impurity, and is connected to the source electrode 18. On the other hand, the buried electrode 46 is isolated from the drain electrode 19 and the gate electrode 13. The configuration of this embodiment other than the foregoing is similar to that of the above first embodiment.

The embodiments described above can realize a semiconductor device and a method for manufacturing the same facilitating increasing the integration density.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a semiconductor substrate member with a plurality of pairs of elongated projections formed in an upper surface;
an insulating member provided between each pair of the elongated projections and having an upper surface located below an upper end of each elongated projection;
a gate electrode provided immediately below the insulating member;
a gate insulating film provided between the semiconductor substrate member and the gate electrode;
a first electrode connected to the upper surface of the semiconductor substrate member; and
a second electrode connected to a lower surface of the semiconductor substrate member,
the semiconductor substrate member including:
a second semiconductor layer of a first conductivity type connected to the second electrode, a lower end portion of the gate electrode extending into the second semiconductor layer;
a base layer of a second conductivity type provided on the second semiconductor layer, the gate electrode penetrating through the base layer;
a first semiconductor layer of the first conductivity type constituting each elongated projection and connected to the first electrode; and
a carrier ejection layer of the second conductivity type provided immediately below a region of an upper layer portion of the semiconductor substrate member between the pair of the elongated projections, connected to the first electrode, and having a higher effective impurity concentration than the base layer.

2. The device according to claim 1, further comprising:
a buried electrode provided immediately below the gate electrode in the semiconductor substrate member, isolated from the gate electrode and the second electrode, and connected to the first electrode.

3. A semiconductor device comprising:
a semiconductor substrate member with a plurality of trenches formed in an upper surface;
a gate electrode provided in the trench;
a gate insulating film provided between the semiconductor substrate member and the gate electrode;
a first electrode connected to the upper surface of the semiconductor substrate member; and
a second electrode connected to a lower surface of the semiconductor substrate member,
the semiconductor substrate member including:
a second semiconductor layer of a first conductivity type connected to the second electrode, a lower end portion of the gate electrode extending into the second semiconductor layer;
a base layer of a second conductivity type provided on the second semiconductor layer, the gate electrode penetrating through the base layer;
a first semiconductor layer of the first conductivity type provided on the base layer and connected to the first electrode; and
a carrier ejection layer of the second conductivity type provided in a region spaced from the gate insulating film between the trenches, the carrier ejection layer being connected to the first electrode and having a higher effective impurity concentration than the base layer, and
the first semiconductor layer including:
a lower section formed from monocrystalline silicon; and
an upper section having a higher impurity concentration than the lower section and formed from polycrystalline silicon.

4. The device according to claim 3, wherein
a plurality of pairs of elongated projections are formed in the upper surface of the semiconductor substrate member,
an upper portion of the trench is formed between each pair of the elongated projections, and
the device further comprises an insulating member provided in the upper portion of the trench.

5. A semiconductor device comprising:
a semiconductor substrate member with a plurality of elongated projections formed in an upper surface;
an insulating member buried in the semiconductor substrate member and having an upper portion located in each of the elongated projections;
a gate electrode provided immediately below the insulating member;
a gate insulating film provided between the semiconductor substrate member and the gate electrode;
a first electrode connected to the upper surface of the semiconductor substrate member; and
a second electrode connected to a lower surface of the semiconductor substrate member,
the semiconductor substrate member including:
a second semiconductor layer of a first conductivity type connected to the second electrode, a lower end portion of the gate electrode extending into the second semiconductor layer;
a base layer of a second conductivity type provided on the second semiconductor layer, the gate electrode penetrating through the base layer;
a first semiconductor layer of the first conductivity type provided on the base layer, covering an upper surface of the insulating member, and being in contact with the first electrode; and
a carrier ejection layer of the second conductivity type provided immediately below a region between the elongated projections, being in contact with the first semiconductor layer and the base layer, and having a higher effective impurity concentration than the base layer.

6. The device according to claim 5, further comprising:
a buried electrode provided immediately below the gate electrode in the semiconductor substrate member, isolated from the gate electrode and the second electrode, and connected to the first electrode.

7. A semiconductor device comprising:
a semiconductor substrate member with a plurality of trenches formed in an upper surface;
a gate electrode provided in the trench;
a gate insulating film provided between the semiconductor substrate member and the gate electrode;
a first electrode connected to the upper surface of the semiconductor substrate member; and
a second electrode connected to a lower surface of the semiconductor substrate member, the semiconductor substrate member including:
- a second semiconductor layer of a first conductivity type connected to the second electrode, a lower end portion of the gate electrode extending into the second semiconductor layer;
- a base layer of a second conductivity type provided on the second semiconductor layer, the gate electrode penetrating through the base layer;
- a first semiconductor layer of the first conductivity type provided on the base layer and connected to the first electrode; and
- a carrier ejection layer of the second conductivity type provided in a region spaced from the gate insulating film between the trenches, the carrier ejection layer being connected to the first electrode and having a higher effective impurity concentration than the base layer, and impurity concentration profile along a vertical direction in the first semiconductor layer including a point where impurity concentration discontinuously changes, and the impurity concentration above the point being higher than the impurity concentration below the point.

8. The device according to claim 7, wherein
a plurality of pairs of elongated projections are formed in the upper surface of the semiconductor substrate member,
an upper portion of the trench is formed between each pair of the elongated projections, and
the device further comprises an insulating member provided in the upper portion of the trench.

9. A semiconductor device comprising:
a semiconductor substrate member made of silicon with a plurality of trenches formed in an upper surface;
a gate electrode provided in the trench;
a gate insulating film provided between the semiconductor substrate member and the gate electrode;
a silicide film in contact with the upper surface of the semiconductor substrate member;
a first electrode in contact with an upper surface of the silicide film; and
a second electrode connected to a lower surface of the semiconductor substrate member,
the semiconductor substrate member including:
- a second semiconductor layer of a first conductivity type connected to the second electrode, a lower end portion of the gate electrode extending into the second semiconductor layer;
- a base layer of a second conductivity type provided on the second semiconductor layer, the gate electrode penetrating through the base layer;
- a first semiconductor layer of the first conductivity type having a lower effective impurity concentration than the silicide film, provided on the base layer, and being in contact with the silicide film; and
- a carrier ejection layer of the second conductivity type provided in a region spaced from the gate insulating film between the trenches, the carrier ejection layer being connected to the first electrode and having a higher effective impurity concentration than the base layer, and in impurity concentration profile along a vertical direction in the silicide film and the first semiconductor layer, impurity concentration discontinuously changes at an interface between the silicide film and the first semiconductor layer.

10. The device according to claim 9, wherein
a plurality of pairs of elongated projections are formed in the upper surface of the semiconductor substrate member,
an upper portion of the trench is formed between each pair of the elongated projections, and
the device further comprises an insulating member provided in the upper portion of the trench.

* * * * *